US011925029B2

United States Patent
Ito et al.

(10) Patent No.: US 11,925,029 B2
(45) Date of Patent: Mar. 5, 2024

(54) SEMICONDUCTOR DEVICE

(71) Applicant: Kioxia Corporation, Tokyo (JP)

(72) Inventors: Takamasa Ito, Nagoya (JP); Hiroshi Matsumoto, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 357 days.

(21) Appl. No.: 17/124,808

(22) Filed: Dec. 17, 2020

(65) Prior Publication Data
US 2022/0068948 A1 Mar. 3, 2022

(30) Foreign Application Priority Data

Sep. 1, 2020 (JP) .................................. 2020-147055

(51) Int. Cl.
*H10B 43/50* (2023.01)
*H10B 43/10* (2023.01)
*H10B 43/27* (2023.01)
*H10B 43/40* (2023.01)

(52) U.S. Cl.
CPC ............ *H10B 43/50* (2023.02); *H10B 43/10* (2023.02); *H10B 43/27* (2023.02); *H10B 43/40* (2023.02)

(58) Field of Classification Search
CPC .. H10B 43/50; H10B 41/50; H10B 20/40–65; H10B 53/20; H10B 41/20–27; H10B 43/20–27; H10B 51/20; H10B 63/84–845; H01L 27/11548; H01L 27/11595; H01L 27/11512; H01L 27/11273; H01L 27/1128; H01L 27/11514; H01L 27/11551; H01L 27/11553; H01L 27/11556; H01L 27/11578; H01L 27/1158; H01L 27/11582; H01L 27/11597; H01L 27/2481; H01L 27/249
See application file for complete search history.

(56) References Cited

U.S. PATENT DOCUMENTS

2017/0084626 A1* 3/2017 Kim .................. H01L 21/76831
2018/0247951 A1* 8/2018 Fujii ...................... H10B 43/50

* cited by examiner

*Primary Examiner* — Amar Movva
(74) *Attorney, Agent, or Firm* — Oblon, McClelland, Maier & Neustadt, L.L.P.

(57) ABSTRACT

A semiconductor device includes a semiconductor substrate on which a first insulation film is provided. A first conductive film is on the first insulation film. First electrode films are on the first conductive film and stacked. A charge accumulation member is between one of the first electrode films and the semiconductor member. The first conductive film includes a main body arranged below the first electrode films and an outer peripheral portion provided in an outer periphery of the main body to be apart from the main body. First and second slits are alternately provided in the outer peripheral portion, and extend along the outer periphery of the main body. The first and second slits are apart from each other as viewed in the stacking direction, and partly overlap each other as viewed in a first direction directed from the main body toward the outer peripheral portion.

9 Claims, 30 Drawing Sheets

SEMICONDUCTOR DEVICE

CROSS REFERENCE TO RELATED APPLICATIONS

This application is based upon and claims the benefit of priority from the prior Japanese Patent Application No. 2020-147055, filed on Sep. 1, 2020, the entire contents of which are incorporated herein by reference.

FIELD

The embodiments of the present invention relate to a semiconductor device.

BACKGROUND

A semiconductor device such as a NAND flash memory may have a configuration in which a memory cell array is provided above a CMOS (Complementary Metal Oxide Semiconductor) circuit for miniaturization. In this case, source lines of the memory cell array are arranged between the memory cell array and the CMOS circuit. Charges may be accumulated in the source lines to cause arcing in an etching process for forming memory holes or slits that penetrate through the memory cell array arranged above the source lines. In order to prevent this arcing, the source lines are partly connected to a polysilicon layer that is provided in a dicing region and is grounded in a process of processing a semiconductor wafer, thereby allowing the charges to be discharged to the ground via a connecting portion between the source lines and the polysilicon layer.

However, in a dicing process, film separation at an end of the memory chip may propagate through this connecting portion to reach an inner portion of the memory chip.

DETAILED DESCRIPTION

Figure 1A:
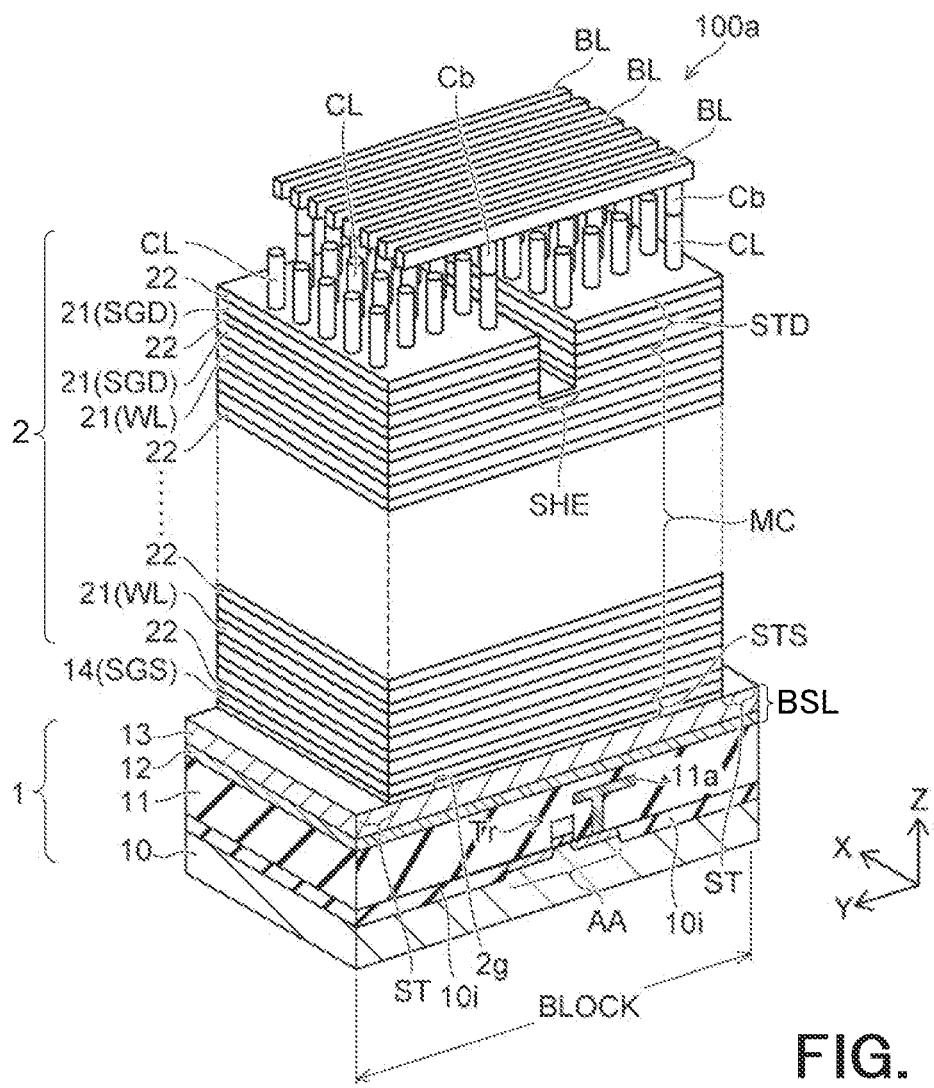
FIG. 1A is a schematic perspective view of an example of a semiconductor storage device according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device comprising according to the present embodiment comprises a semiconductor substrate. A first insulation film is provided on the semiconductor substrate. A first conductive film is provided on the first insulation film. A plurality of first electrode films are provided on the first conductive film and stacked to be apart from each other. A semiconductor member extends in a stacking direction of the first electrode films in a stacked structure of the first electrode films. A charge accumulation member is provided between one of the first electrode films and the semiconductor member. The first conductive film includes a main body arranged below the first electrode films and an outer peripheral portion provided in an outer periphery of the main body to be apart from the main body. First and second slits are alternately provided in the outer peripheral portion, and extend along the outer periphery of the main body. The first and second are apart from each other as viewed in the stacking direction, and partly overlap each other as viewed in a first direction directed from the main body toward the outer peripheral portion.

First Embodiment

Figure 1B:
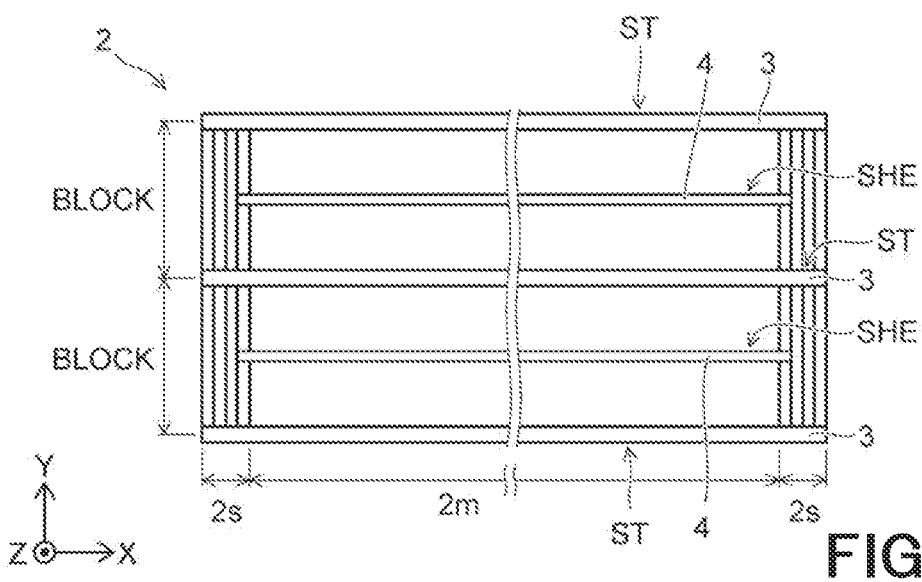
FIG. 1B is a schematic plan view of a stack 2.
Figure 2A:
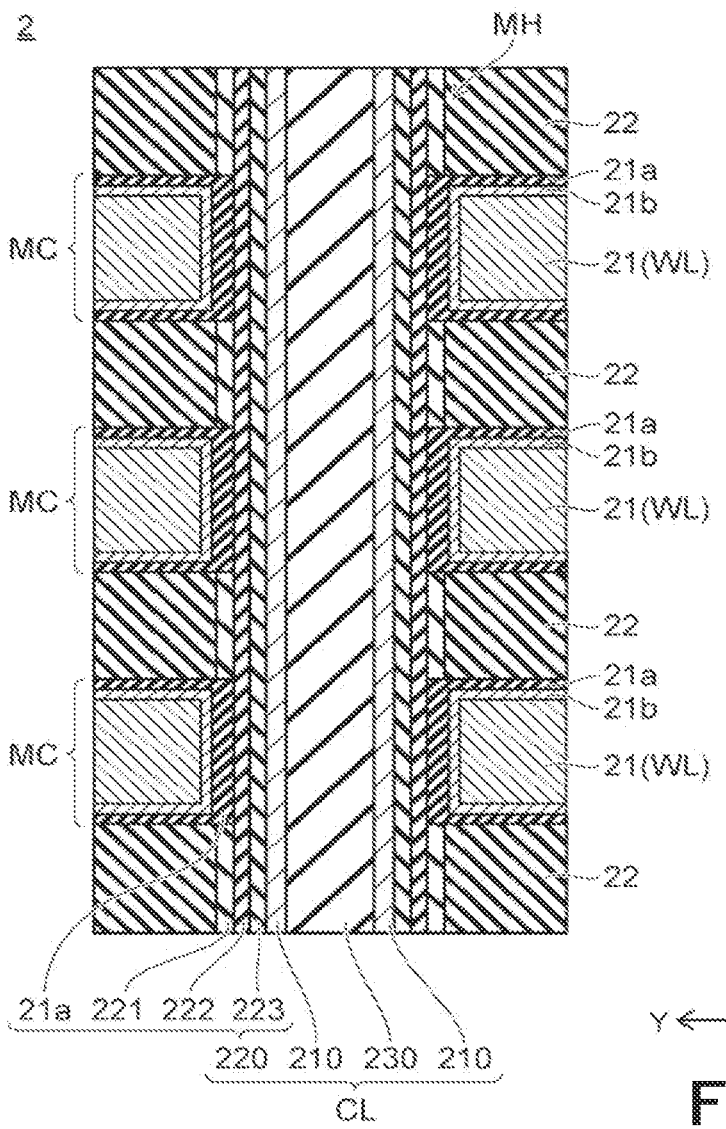
FIG. 2A is a schematic cross-sectional view of an example of a memory cell having a three-dimensional configuration.
Figure 2B:
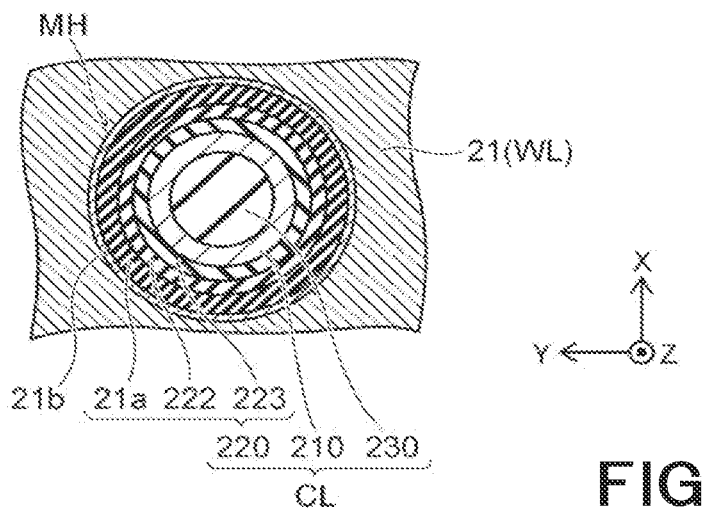
FIG. 2B is a schematic cross-sectional view of an example of a memory cell having a three-dimensional configuration.
Figure 3:
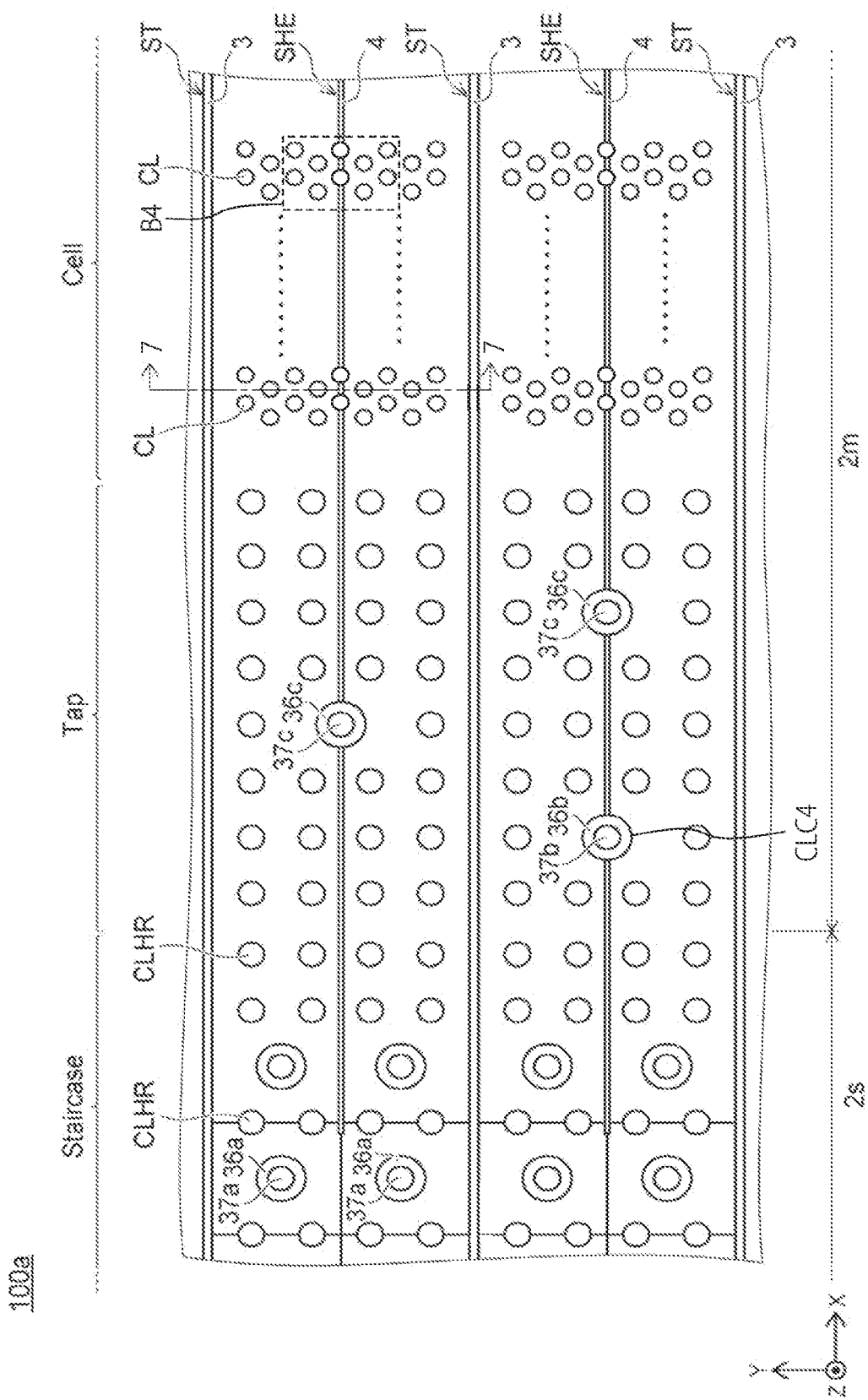
FIG. 3 is a schematic plan view of an example of the semiconductor storage device according to the first embodiment.

FIG. 1A is a schematic perspective view of an example of a semiconductor storage device 100a according to a first embodiment. FIG. 1B is a schematic plan view of a stack 2. In the present specification, a stacking direction of the stack 2 is assumed as the Z-direction. One of directions that cross the Z-direction such as at right angles is assumed as the Y-direction. One of directions that cross the Z-direction and the Y-direction such as at right angles is assumed as the X-direction. FIG. 2A and 2B are schematic cross-sectional views of an example of a memory cell having a three-dimensional configuration. FIG. 3 is a schematic plan view of an example of the semiconductor storage device 100a according to the first embodiment.

As illustrated in FIG. 1A to FIG. 3, the semiconductor storage device 100a according to the first embodiment is a non-volatile memory including the memory cells having a three-dimensional configuration.

The semiconductor storage device 100a includes a base portion 1, the stack 2, a deep slit ST (a plate-shaped portion 3), a shallow slit SHE (a plate-shaped portion 4), and a plurality of column portions CL.

The base portion 1 includes a substrate 10, an interlayer dielectric film 11, a conductive layer 12, and a semiconductor portion 13. The interlayer dielectric film 11 as a first insulation film is provided on the substrate 10. The conductive layer 12 is provided on the interlayer dielectric film 11. The semiconductor portion 13 is provided on the conductive layer 12.

The substrate 10 is a semiconductor substrate such as a silicon substrate. The conductivity type of silicon (Si) is of a p-type, for example. An element isolation region 10i, for example, is provided in a surface region of the substrate 10. The element isolation region 10i is an insulating region that contains silicon oxide, for example, and marks off an active area AA in the surface region of the substrate 10. A source region and a drain region of a transistor Tr are provided in the active area AA. The transistor Tr configures a peripheral circuit (a CMOS (Complementary Metal Oxide Semiconductor) circuit) of the non-volatile memory. The CMOS circuit is provided below a buried source layer BSL and on the substrate 10. The interlayer dielectric film 11 contains materials such as silicon oxide ($SiO_2$) and insulates the transistor Tr. A wire 11a is provided in the interlayer dielectric film 11. The wire 11a is electrically connected to the transistor Tr. The conductive layer 12 contains a conductive metal such as tungsten (W). The semiconductor portion 13 contains materials such as silicon. The conductivity type of silicon is of an n-type, for example. A portion of the semiconductor portion 13 may contain undoped silicon.

The conductive layer 12 and the semiconductor portion 13 are electrically connected to each other as an integrated first conductive film and serves as a common source electrode (a buried source layer) of the memory cell array (2m in FIG. 1B). Therefore, the conductive layer 12 and/or the semiconductor portion 13 may be also called the buried source layer BSL.

The stack 2 is provided above the substrate 10 and is located in the Z-direction with respect to the conductive layer 12 and the semiconductor portion 13 (the buried source layer BSL). The stack 2 is configured by a plurality of electrode films 21 and a plurality of insulation layers 22 alternately stacked along the Z-axis direction. The electrode films 21 contain a conductive metal such as tungsten. The insulation layers 22 contain silicon oxide, for example. The insulation layers 22 insulate the electrode films 21 from each other. The number of the stacked electrode films 21 and the number of the stacked insulation layers 22 may be any number. The insulation layer 22 may be an air gap, for example. An insulation film 2g, for example, is provided between the stack 2 and the semiconductor portion 13. The insulation film 2g contains silicon oxide ($SiO_2$), for example. The insulation film 2g may contain a high dielectric material having a higher relative permittivity than silicon oxide. The high dielectric material is metal oxide, for example.

The electrode films 21 include a a plurality of word lines WL. The source-side selection gate SGS is a gate electrode of a source-side selection transistor STS. The word lines WL serve as gate electrodes of memory cells MC. The drain-side selection gate SGD is a gate electrode of a drain-side selection transistor STD. The source-side selection gate SGS is provided under the stack 2. The drain-side selection gate SGD is provided above the stack 2. The lower region is a region of the stack 2 closer to the base portion 1, and the upper region is a region of stack 2 farther from the base portion 1. The word lines WL are provided between the source-side selection gate SGS and the drain-side selection gate SGD.

Among the insulation layers 22, the insulation layer 22 that insulates the source-side selection gate SGS and the word lines WL from each other may have a larger thickness in the Z-direction than the insulation layer 22 that insulates the word lines WL from each other, for example. Further, a cover insulation film (not illustrated) may be provided on the uppermost insulation layer 22 that is the farthest from the base portion 1. The cover insulation film contains silicon oxide, for example.

The semiconductor storage device 100a includes the memory cells MC connected in series between the source-side selection transistor STS and the drain-side selection transistor STD. The configuration in which the source-side selection transistor STS, the memory cells MC, and the drain-side selection transistor STD are connected in series is called "memory string" or "NAND string". The memory string is connected to bit lines BL, for example, via contacts Cb. The bit lines BL are provided above the stack 2 and extend in the Y-direction.

The deep slits ST and the shallow slits SHE are provided in the stack 2. The deep slits ST extend in the X-direction, and are provided in the stack 2 to penetrate through the stack 2 from the top end of the stack 2 to the base portion 1. The plate-shaped portion 3 is provided in the deep slit ST (FIG. 1B). The plate-shaped portion 3 includes at least an insulator, for example. This insulator is silicon oxide, for example. The plate-shaped portion 3 may be electrically insulated from the stack 2 by the insulator and may include a conductor electrically connected to the buried source layer BSL at the same time. The shallow slits SHE extend in the X-direction and are provided from the top end of the stack 2 to the middle of the stack 2. A plate-shaped portion 4, for example, is provided in the shallow slit SHE (FIG. 1B). The plate-shaped portion 4 is made of silicon oxide, for example.

As illustrated in FIG. 1B, the stack 2 includes a staircase portion 2s and the memory cell array 2m. The staircase portion 2s is provided at an edge of the stack 2. The memory cell array 2m is sandwiched between the staircase portions 2s or is surrounded by the staircase portions 2s. The deep slit ST is provided from the staircase portion 2s at one end of the stack 2 to the staircase portion 2s at the other end of the stack 2 via the memory cell array 2m. The shallow slit SHE is provided at least in the memory cell array 2m.

As illustrated in FIG. 3, the memory cell array 2m includes a cell region (Cell) and a tap region (Tap). The staircase portion 2s includes a staircase region (Staircase) (FIG. 3). The tap region is provided, for example, between the cell region and the staircase region. Although not illustrated in FIG. 3, the tap region may be provided between the cell regions. The staircase region is a region where wires 37a are provided. The tap region is a region where wires 37b and 37c are provided. The wires 37a to 37c extend in the Z-direction, for example. Each wire 37a is electrically connected to the electrode film 21, for example. The wire 37b is electrically connected to the conductive layer 12, for example. The wire 37c is electrically connected to the wire 11a, for example.

A portion of the stack 2 sandwiched between the two plate-shaped portions 3 illustrated in FIG. 1B is called a block (BLOCK). The block is the minimum unit for erasing data, for example. The plate-shaped portion 4 is provided in the block. The stack 2 between the plate-shaped portion 3 and the plate shaped portion 4 is called a finger. The drain-side selection gate SGD is divided for each finger. Therefore, in data writing and data reading, it is possible to place one finger in a block in a selected state by the drain-side selection gate SDG.

Each of column portions CL is provided in a memory hole MH provided in the stack 2. Each column portion CL penetrates through the stack 2 from the top end of the stack 2 along the Z-direction and is provided in the stack 2 and in the buried source layer BSL. Each of the column portions CL includes a semiconductor body 210, a memory film 220, and a core layer 230. The column portion CL includes the core layer 230 provided at its center, the semiconductor body 210 provided around the core layer 230, and the memory film 220 provided around the semiconductor body 210. The semiconductor body 210 is electrically connected to the buried source layer BSL. The memory film 220 has a charge trapping portion between the semiconductor body 210 and the electrode film 21. The column portions CL selected one by one from the respective fingers are connected to one bit line BL in common via the contacts Cb. The column portions CL are provided in the cell region (Cell), for example (FIG. 3).

The shape of the memory hole MH in an X-Y plane is, for example, circular or elliptical as illustrated in FIGS. 2A and 2B. A block insulation film 21a that configures a portion of the memory film 220 may be provided between the electrode film 21 and the insulation layer 22. The block insulation film 21a is, for example, a silicon oxide film or a metal oxide film. An example of the metal oxide is aluminum oxide. A barrier film 21b may be provided between the electrode film 21 and the insulation layer 22 and between the electrode film 21 and the memory film 220. In a case where the electrode film 21 is, for example, made of tungsten, a multilayer film of titanium nitride and titanium, for example, is selected as the barrier film 21b. The block insulation film 21a prevents back tunneling of charges from the electrode film 21 toward the memory film 220. The barrier film 21b improves adhesion between the electrode film 21 and the block insulation film 21a.

The semiconductor body 210 as a semiconductor member has a tubular shape with a bottom, for example. The semiconductor body 210 contains silicon, for example. This silicon is polysilicon obtained by crystallizing amorphous silicon, for example. The semiconductor body 210 is made of, for example, undoped silicon. The semiconductor body 210 may be made of, for example, p-type silicon. The semiconductor body 210 serves as a channel of each of the drain-side selection transistor STD, the memory cell MC, and the source-side selection transistor STS. The semiconductor body 210 is electrically connected to the buried source layer BSL.

A portion of the memory film 220, other than the block insulation film 21a, is provided between an inner wall of the memory hole MH and the semiconductor body 210. The shape of the memory film 220 is tubular, for example. The memory cells MC each include a storage region between the semiconductor body 210 and the electrode film 21 that serves as the word line WL, and are stacked in the Z-direction. The memory film 220 includes a cover insulation film 221, a charge trapping film 222, and a tunnel insulation film 223, for example. The semiconductor body 210, the charge trapping film 222, and the tunnel insulation film 223 extend in the Z-direction.

The cover insulation film 221 is provided between the insulation layer 22 and the charge trapping film 222. The cover insulation film 221 contains silicon oxide, for example. The cover insulation film 221 protects the charge trapping film 222 from being etched when a sacrifice film (not illustrated) is replaced with the electrode film 21 (in a replacement process). The cover insulation film 221 may be removed from between the electrode film 21 and the memory film 220 in the replacement process. In this case, the block insulation film 21a, for example, is provided between the electrode film 21 and the charge trapping film 222 as illustrated in FIGS. 2A and 2B. In a case where the replacement process is not used for forming the electrode films 21, the cover insulation film 221 may not be included.

The charge trapping film 222 is provided between the block insulation film 21a and the cover insulation film 221, and the tunnel insulation film 223. The charge trapping film 222 contains materials such as silicon nitride, and has trap sites where charges are trapped therein. A portion of the charge trapping film 222, which is sandwiched between the electrode film 21 serving as the word line WL and the semiconductor body 210, configures a storage region of the memory cell MC as a charge trapping portion. A threshold voltage of the memory cell MC is changed depending on whether charges are present in the charge trapping portion or in accordance with the amount of charges trapped in the charge trapping portion. Accordingly, the memory cell MC retains information.

The tunnel insulation film 223 is provided between the semiconductor body 210 and the charge trapping film 222. The tunnel insulation film 223 contains silicon oxide, or contains silicon oxide and silicon nitride, for example. The tunnel insulation film 223 is a potential barrier between the semiconductor body 210 and the charge trapping film 222. For example, when electrons are injected from the semiconductor body 210 to the charge trapping portion (a write operation) and when holes are injected from the semiconductor body 210 to the charge trapping portion (an erase operation), the electrons and the holes each pass (tunnel) through the potential barrier by the tunnel insulation film 223.

The core layer 230 is embedded in an inner space of the tubular semiconductor body 210. The shape of the core layer 230 is columnar, for example. The core layer 230 contains materials such as silicon oxide, and is insulating.

Each of column portions CLHR in FIG. 3 is provided in a hole provided in the stack 2. The hole penetrates through the stack 2 from the top end of the stack 2 along the Z-direction and is provided in the stack 2 and the semiconductor portion 13. Each column portion CLHR contains at least an insulator. This insulator is silicon oxide, for example. Each column portion CLHR may have the same configuration as the column portion CL. The column portions CLHR are provided in the staircase region (Staircase) and the tap region (Tap), for example. The column portions CLHR serve as support members for keeping gaps formed in the staircase region and the tap region when a sacrifice film (not illustrated) is replaced with the electrode film 21 (in a replacement process). A plurality of column portions CLC4 are formed in the tap region (Tap) of the stack 2. Each column portion CLC4 includes the wire 37b or 37c. The wire 37b is electrically insulated from the stack 2 by an insulator 36b. The wire 37b is electrically connected to any of the wire 11a and the like.

The column portions CL, that is, the memory holes MH are arranged in hexagonal close packing between two of the slits ST which are adjacent to each other in the Y-direction in a planar layout. The shallow slits SHE are provided to overlap some column portions CL as illustrated in FIG. 3. The column portion CL under the shallow slit SHE does not configure a memory cell.

Figure 17:
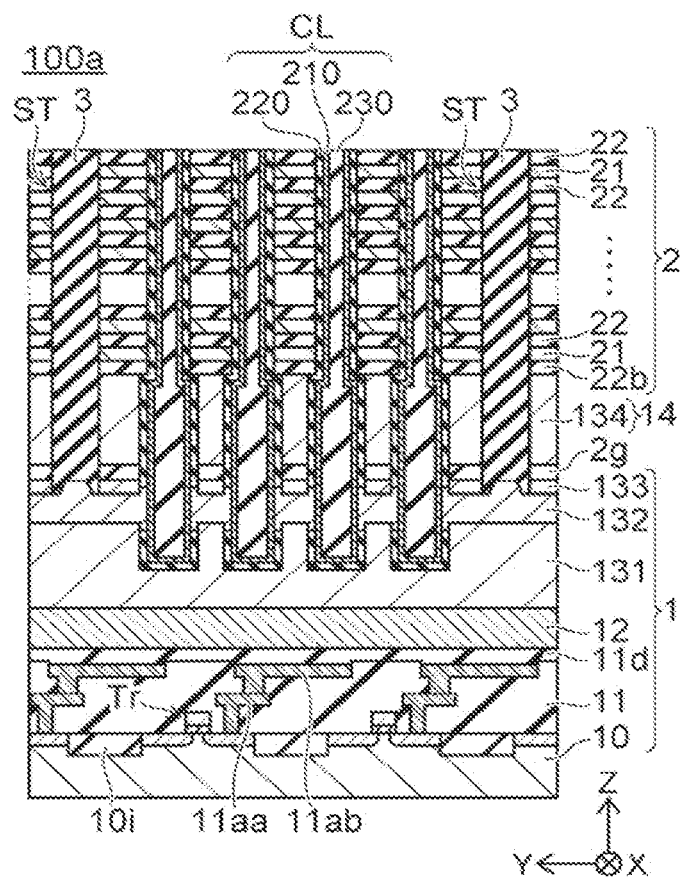
FIG. 17 is a cross-sectional view illustrating an example of a manufacturing method of a semiconductor storage device following FIG. 16.

The semiconductor portion 13 in FIG. 1A includes an n-type semiconductor layer 131, an n-type semiconductor layer 132, and an n-type or undoped semiconductor layer 133 shown in FIG. 17, for example. As shown in FIG. 17, the semiconductor layer 131 is in contact with the conductive layer 12. The semiconductor layer 132 is in contact with the semiconductor layer 131 and the semiconductor body 210 shwon in FIG. 2A. For example, as shown in FIG. 17, the semiconductor layer 132 extends in a portion where the memory film 220 is removed, and is in contact with the semiconductor body 210. Further, the semiconductor layer 132 is provided to surround the semiconductor body 210 in an X-Y plane. The semiconductor layer 133 is in contact with the semiconductor layer 132.

The semiconductor storage device 100a further includes a semiconductor portion 14. The semiconductor portion 14 is located between the stack 2 and the semiconductor portion 13. The semiconductor portion 14 includes a semiconductor layer 134 shown in FIG. 17. As shwon in FIG. 17, the semiconductor layer 134 is provided between an insulation layer 22b that is the closest one of the insulation layers 22 to the semiconductor portion 13 and the insulation film 2g. The conductivity type of the semiconductor layer 134 is an n-type, for example. The semiconductor layer 134 serves as the source-side selection gate SGS, for example.

Figure 4:
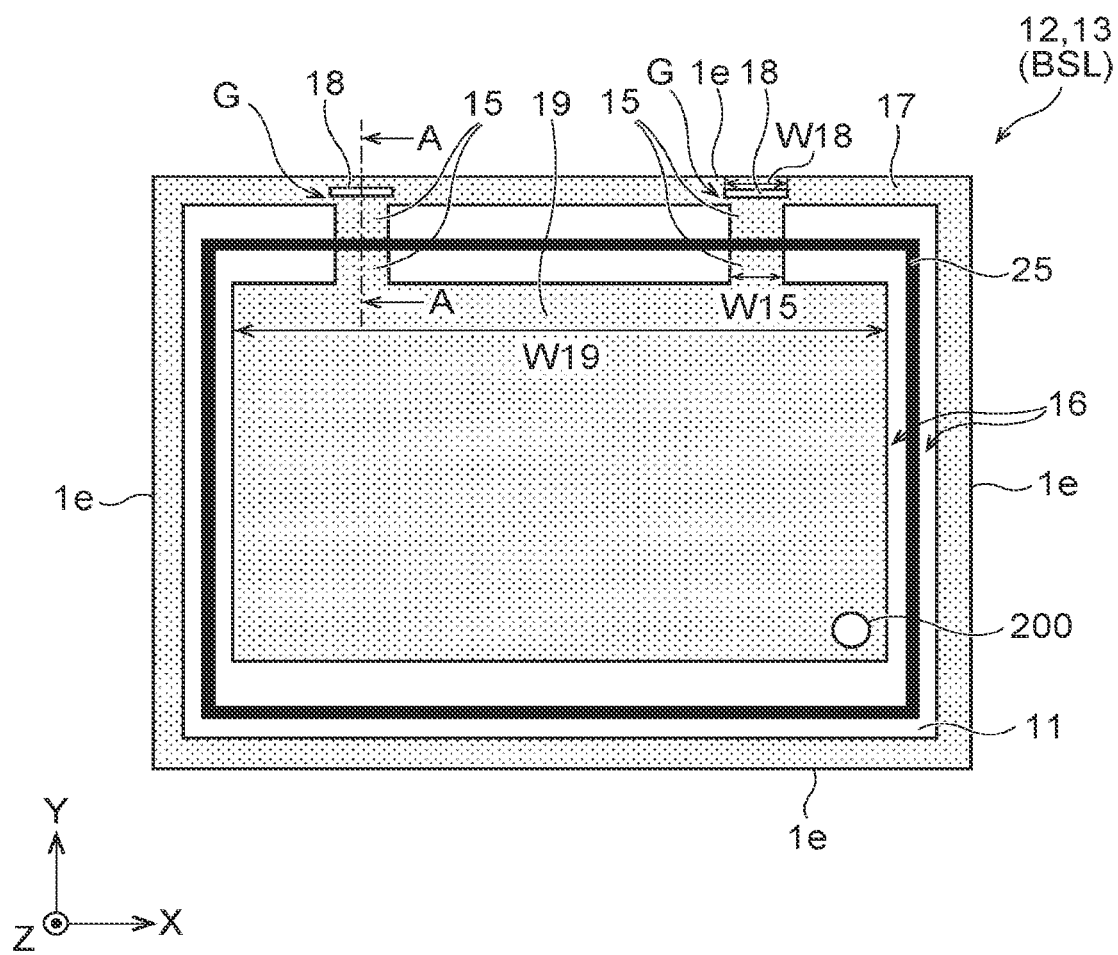
FIG. 4 is a plan view illustrating a configuration example of the conductive layer and the semiconductor portion.
Figure 5:
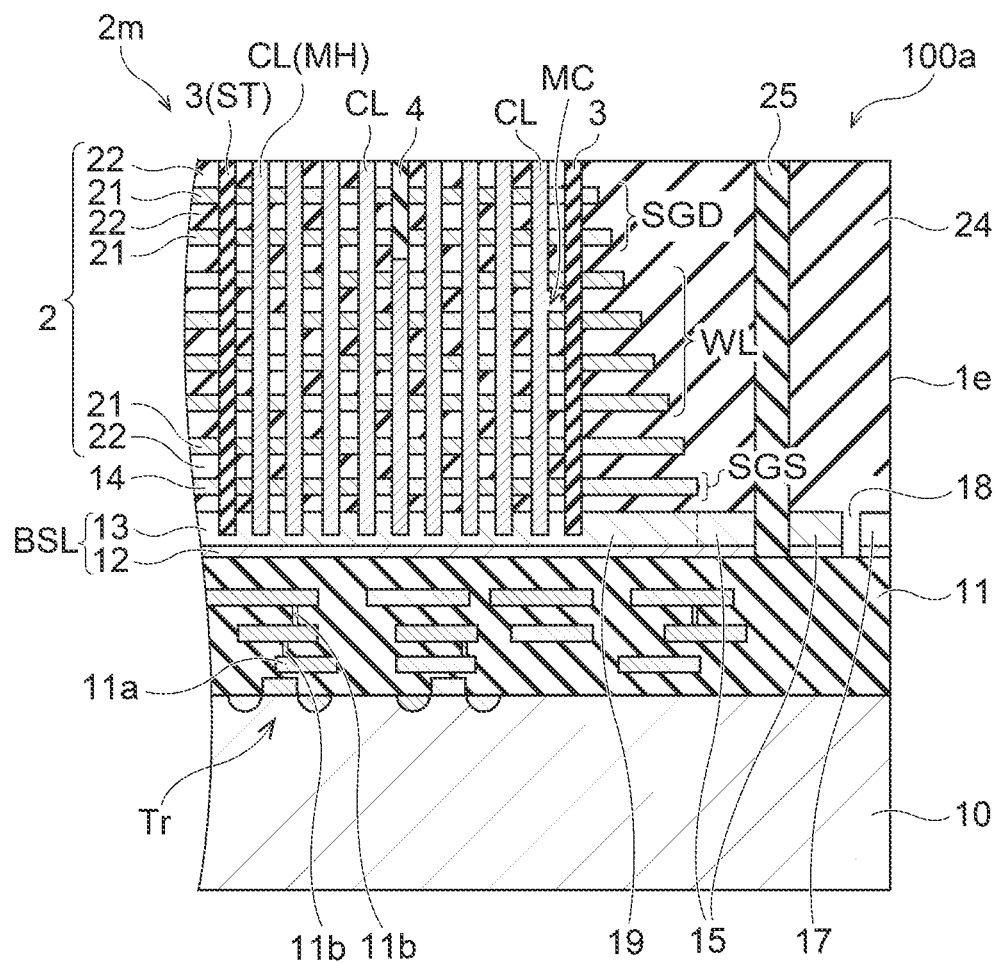
FIG. 5 is a cross-sectional view along a line A-A in FIG. 4.

FIG. 4 is a plan view illustrating a configuration example of the conductive layer 12 and the semiconductor portion 13 (the buried source layer BSL). FIG. 4 illustrates a plane of the buried source layer BSL corresponding to the whole chip of the semiconductor storage device 100a. FIG. 5 is a cross-sectional view along a line A-A in FIG. 4.

The buried source layer BSL as a first conductive film includes a main body 19, a protrusion 15, and an outer peripheral portion 17. The main body 19, the protrusion 15, and the outer peripheral portion 17 are formed by the same layer of the same material and are electrically integrated together as the buried source layer BSL. The buried source layer BSL is electrically connected to the semiconductor body 210 and serves as a source of the memory cell array 2m.

The main body 19 is arranged below the electrode films 21 as illustrated in FIG. 5. That is, the main body 19 is provided directly above the transistor Tr configuring a CMOS circuit and directly below the memory cell array 2m. As illustrated in FIG. 4, the main body 19 has a substantially rectangular shape as viewed in the stacking direction of the stack 2 (the Z-direction). In the present specification, the term "substantially rectangular shape" includes shapes similar to a rectangle, for example, a quadrilateral having one or more curved sides, as well as a rectangle.

The outer peripheral portion 17 is provided in an outer periphery of the main body 19 to be apart from the main body 19. The outer peripheral portion 17 is provided in a dicing line, and its end le is an outer edge of a chip of the semiconductor storage device 100a. Therefore, the semiconductor substrate 10 and the like are cut by dicing at the end le of the outer peripheral portion 17. A space 16 is provided between the outer peripheral portion 17 and the main body 19. In the present embodiment, as illustrated in FIG. 5, a stacked structure of the electrode films 21 or the stack 2 of the insulation layers 22 (for example, silicon oxide films) and sacrifice films 23 (for example, silicon nitride films) is not provided above the protrusion 15, the outer peripheral portion 17, and an opening 18. That is, the word lines WL and an ONON film are not provided above the protrusion 15, the outer peripheral portion 17, and the opening 18. A single layer of an interlayer dielectric film 24 (for example, a silicon oxide film) is provided above the protrusion 15, the outer peripheral portion 17, and the opening 18. Similarly, also above the outer peripheral portion 17 between the opening 18 and the protrusion 15, the single layer of the interlayer dielectric film 24 (for example, a silicon oxide film) is provided, but a stacked structure of the electrode films 21 and a stacked structure of the insulation layers 22 and the sacrifice films 23 are not provided.

The protrusion 15 is provided in a portion of the space 16 between the main body 19 and the outer peripheral portion 17 and, in a manufacturing process, serves as a connector that partly connects the main body 19 and the outer peripheral portion 17. In a finished product, the protrusion 15 is disconnected as illustrated in FIG. 4 and extends in the Y-direction from the main body 19 to the outer peripheral portion 17 or from the outer peripheral portion 17 to the main body 19. A width W15 in the X-direction of the protrusion 15 is smaller than a width W19 of the main body 19. That is, although the main body 19 and the outer peripheral portion 17 are partly connected to each other via the protrusion 15 in a manufacturing process, they are disconnected from each other by an insulation member 25 after completion. Since the protrusion 15 is not divided during the manufacturing process, it may be called the connector 15 below. The number of the protrusions 15 is not specifically limited to any specific number. The insulation member 25 may be a seal ring provided to surround the main body 19.

As illustrated in FIG. 4, in a finished product after the buried source layer BSL is formed, a portion of the protrusion (the connector) 15 of the buried source layer BSL is removed and the insulation member 25 is embedded. Therefore, the main body 19 and the outer peripheral portion 17 are electrically isolated from each other by the insulation member 25. Thus, a contact 200 is connected to the main body 19 of the buried source layer BSL from above. A current flows to the main body 19 via the contact 200. The number of the contact 200 is not specifically limited to any specific number, and the contact 200 may be provided in plural.

In the manufacturing process, the protrusion (the connector) 15 electrically connects the main body 19 and the outer peripheral portion 17 to each other, and allows charges accumulated in the main body 19 to be discharged to the semiconductor substrate 10 via the outer peripheral portion 17 when the column portions CL (the memory holes MH) or the plate-shaped portions 3 (the slits ST) in FIG. 5 are formed. Accordingly, arcing between the main body 19 and the wire 11a below the main body 19 (see FIG. 7) can be prevented.

After the column portions CL (the memory holes MH) or the plate-shaped portions 3 (the slits ST) are formed, the protrusion (the connector) 15 is cut by formation of the insulation member 25. In a finished product, as illustrated in FIG. 4, the protrusion 15 connected to the main body 19 protrudes in the Y-direction from the main body 19 toward the outer peripheral portion 17. The protrusion 15 connected to the outer peripheral portion 17 protrudes in the Y-direction from the outer peripheral portion 17 toward the main body 19. The protrusion 15 of the main body 19 and the protrusion 15 of the outer peripheral portion 17 are provided at positions facing each other. Since the protrusion 15 is cut, the capacity of the buried source layer BSL can be reduced, so that a high-speed operation of a source voltage can be achieved.

The outer peripheral portion 17 has the opening 18 at a position facing the protrusion 15 in the Y-direction directed from the main body 19 toward the outer peripheral portion 17 (a first direction). The opening 18 is a slit having a longitudinal direction in the X-direction that is substantially perpendicular to the stacking direction of the stack 2 (the Z-direction) and the Y-direction. The opening 18 is provided to penetrate through the outer peripheral portion 17, that is, the buried source layer BSL in the Z-direction. The interlayer dielectric film 24 is filled in the opening 18. Alternatively, the opening 18 may be hollow. A width W18 in the X-direction of the opening 18 is larger than the width W15 in the X-direction of the protrusion 15.

The opening 18 is arranged near a connecting position between the protrusion 15 and the outer peripheral portion 17 with regard to the direction directed from the main body 19 toward the outer peripheral portion 17 (the Y-direction). The opening 18 is arranged to close the protrusion 15 at the connecting position between the protrusion 15 and the outer peripheral portion 17 as viewed in the Y-direction. Meanwhile, as viewed in the Z-direction or the X-direction, a gap G is provided between the protrusion 15 and the opening 18. The protrusion 15 and the outer peripheral portion 17 are connected to each other via a conductive film of the buried source layer BSL in the gap G. That is, the opening 18 is provided to close the protrusion 15 with a lid at a position apart from the protrusion 15 without cutting the protrusion 15 and the outer peripheral portion 17 from each other.

For example, the width W15 of the protrusion 15 is about 60 µm or more and the width W18 of the opening 18 is about 60 µm or more and is equal to or larger than the width W15. Further, the width of the gap G between the opening 18 and the protrusion 15 in the Y-direction is about 5 µm or more.

The end 1e of a package of the semiconductor storage device 100a is included in a dicing line, and may be damaged by impact when being cut by dicing. For example, impact by dicing may cause separation of the buried source layer BSL in FIG. 1A from the interlayer dielectric film 11 below it or from the interlayer dielectric film 24 above it. Damages such as this film separation are not a problem so long as it occurs only within the outer peripheral portion 17 in FIG. 4.

However, if the opening 18 is not provided, this film separation may propagate from the outer peripheral portion 17 to the main body 19 through the protrusion 15. Film separation in the main body 19 reduces reliability of the semiconductor storage device 100a.

Therefore, in the present embodiment, the outer peripheral portion 17 has the opening 18 in a connecting portion between the protrusion 15 and the outer peripheral portion 17. Accordingly, the film separation described above is limited in the opening 18, and it is possible to prevent propagation of the film separation from the outer peripheral portion 17 to the protrusion 15 and to the main body 19. The opening 18 is provided over the entire thickness in the thickness direction of the outer peripheral portion 17 (the Z-direction). Therefore, it is possible to prevent both film separation between the buried source layer BSL and the interlayer dielectric film 11 below it and film separation between the buried source layer BSL and the interlayer dielectric film 24 above it. Further, the width W18 of the opening 18 is larger than the width W15 of the protrusion 15. Accordingly, even when the film separation propagates in the −Y-direction from any position in the end 1e located in an upper portion of FIG. 4, the opening 18 can prevent propagation of that film separation to the protrusion 15. That is, the opening 18 can protect the entire protrusion 15 from propagation of film separation.

Meanwhile, if the opening 18 electrically disconnects the protrusion 15 from the outer peripheral portion 17, the protrusion (the connector) 15 cannot electrically connect the outer peripheral portion 17 and the main body 19 to each other in formation of the memory holes MH and the slits ST described later. In this case, the protrusion (the connector) 15 cannot allow charges accumulated in the main body 19 to be discharged to the semiconductor substrate 10 (the ground) via the outer peripheral portion 17.

On the other hand, according to the present embodiment, the gap G is provided between the protrusion 15 and the opening 18 as viewed in the Z-direction or the X-direction, and the protrusion 15 and the outer peripheral portion 17 are connected to each other by a conductive film of the buried source layer BSL in the gap G. The outer peripheral portion 17 is located between the opening 18 and the protrusion 15 and is electrically connected to the main body 19. Accordingly, in formation of the memory holes MH and the slits ST, the charges accumulated in the main body 19 can flow to the outer peripheral portion 17 via the protrusion (the connector) 15 and a portion of the outer peripheral portion 17 in the gap G, and can flow to the semiconductor substrate 10. After forming the memory holes MH and the slits ST, the protrusion (the connector) 15 is cut, so that the protrusion 15 is formed.

As described above, according to the present embodiment, the opening 18 can maintain electrical connection between the outer peripheral portion 17 and the main body 19, and can prevent propagation of film separation from the end le from the outer peripheral portion 17 to the protrusion 15 and the main body 19.

In the outer peripheral portion 17 between the opening 18 and the protrusion 15, no separation occurs at an interface between the buried source layer BSL and the interlayer dielectric film 11. In other portions of the outer peripheral portion 17, the buried source layer BSL and the interlayer dielectric film 11 may be separated from each other at the interface therebetween.

Next, a manufacturing method of a semiconductor storage device according to the first embodiment is described.

FIG. 6 to FIG. 17 are cross-sectional views and a plan view illustrating an example of a manufacturing method of a semiconductor storage device according to the first embodiment.

Figure 6:
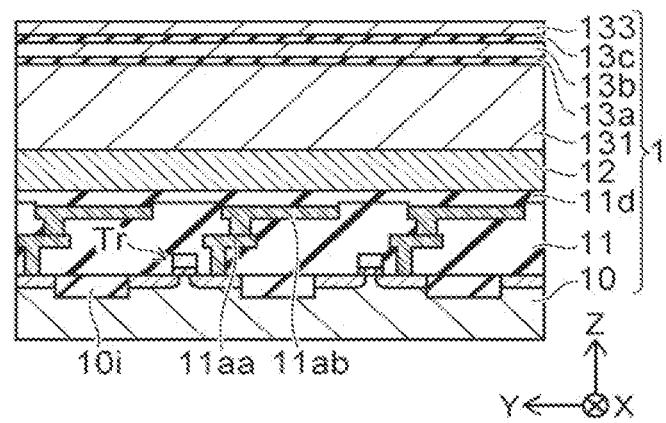
FIG. 6 is a cross-sectional view illustrating an example of a manufacturing method of a semiconductor storage device according to the first embodiment.

As illustrated in FIG. 6, the element isolation region 10i is formed in the substrate 10, and the transistor Tr is formed in the active area AA. Next, the interlayer dielectric film 11 is formed on the substrate 10. The interlayer dielectric film 11 is an interlayer dielectric film, for example, and includes the wire 11a. The wire 11a is a multilayer wire, for example. FIG. 6 illustrates a wire 11aa and a wire 11ab provided above the wire 11aa, as an example. Next, an insulation film 11d is formed on the wire 11ab. The insulation film 11d contains silicon oxide, for example. Next, the conductive layer 12 is formed on the insulation film 11d.

The semiconductor layer 131 is formed on the conductive layer 12. The semiconductor layer 131 contains n-type doped silicon, for example. Next, an intermediate film 13a is formed on the semiconductor layer 131. The intermediate film 13a contains silicon oxide, for example. Next, a sacrifice film 13b is formed on the intermediate film 13a. The sacrifice film 13b contains n-type doped silicon, undoped silicon, or silicon nitride, for example. Next, an intermediate film 13c is formed on the sacrifice film 13b. The intermediate film 13c contains silicon oxide, for example. Next, the semiconductor layer 133 is formed on the intermediate film 13c. The semiconductor layer 133 contains n-type doped silicon or undoped silicon, for example. Accordingly, for example, the base structure of the base portion 1 during manufacturing is obtained.

The conductive layer 12, the semiconductor layer 131, the intermediate film 13a, the sacrifice film 13b, the intermediate film 13c, and the semiconductor layer 133 (hereinafter, "the conductive layer 12 and the like") become a portion of the buried source layer BSL or are replaced with the material for the buried source layer BSL in a later process.

Next, the conductive layer 12 and the like are processed into the pattern described with reference to FIG. 4 by lithography and etching. Since the semiconductor substrate 10 is a wafer at this time, the conductive layer 12 and the like are processed as illustrated in FIG. 7.

Figure 7:
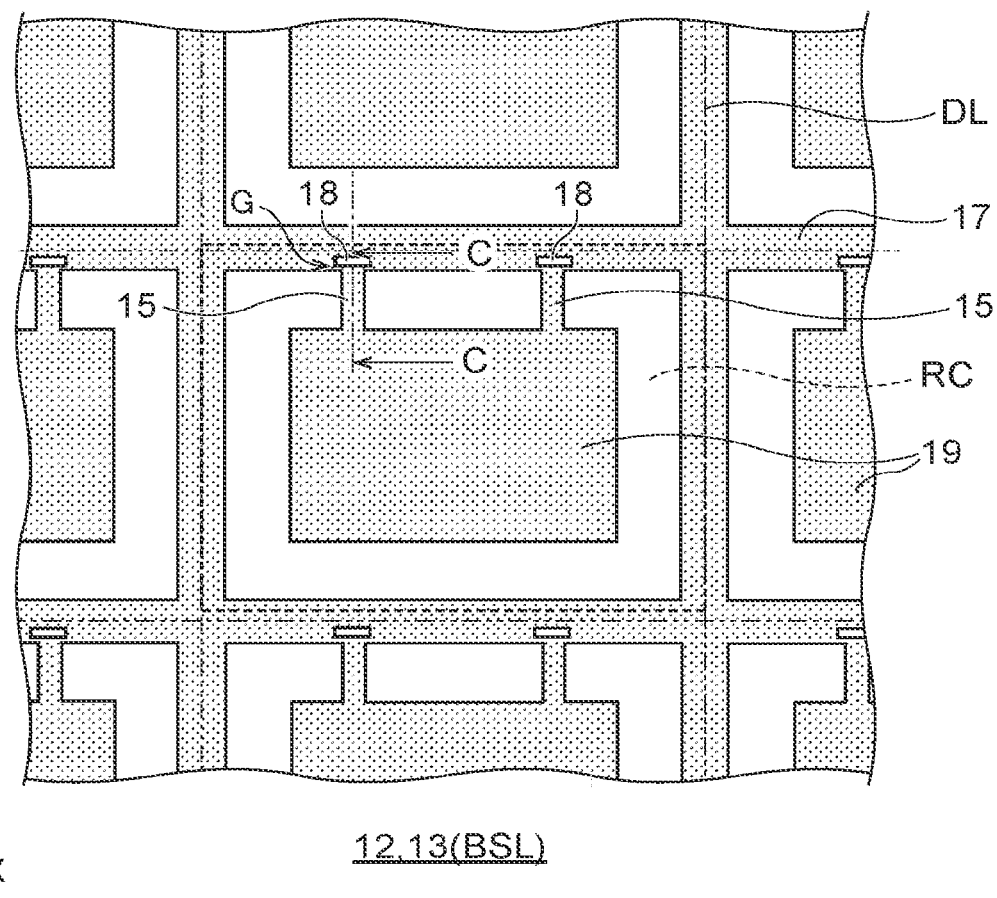
FIG. 7 is a plan view illustrating an example of a manufacturing method of a semiconductor storage device following FIG. 6.

FIG. 7 is a plan view illustrating an example of the conductive layer 12 and the like. The outer peripheral portion 17 of the conductive layer 12 and the like is formed in a lattice along a dicing line DL. The outer peripheral portion 17 is cut by dicing but is left on an outer edge of each semiconductor chip. The main body 19 of the conductive layer 12 and the like is formed in a semiconductor chip region RC. The main body 19 has a rectangular shape that has sides extending in the X-direction and the Y-direction as viewed in the Z-direction. The protrusion (the connector) 15 of the conductive layer 12 and the like is formed to connect the main body 19 and the outer peripheral portion 17 to each other. During a manufacturing process, the protrusion 15 may be called the connector 15 below, because the protrusion 15 is not disconnected. Although the number of the connectors 15 formed for one main body 19 is two, the number is not limited thereto. The connectors 15 extend in the Y-direction and are arranged in the X-direction. The main body 19 in each semiconductor chip region RC is electrically connected to the ground (not illustrated) in an outer peripheral portion of the semiconductor substrate 10 via the connector 15 and the outer peripheral portion 17. The connectors 15 may be arranged to extend in the X-direction.

The outer peripheral portion 17 has the opening 18 in a connecting portion between the protrusion 15 and the outer peripheral portion 17. The opening 18 is provided to penetrate over the entire thickness in the thickness direction of the outer peripheral portion 17 (the Z-direction). The width in the X-direction of the opening 18 is larger than the width in the X-direction of the protrusion 15. Meanwhile, the opening 18 is formed not to hinder electrical connection between the outer peripheral portion 17 and the connector 15 and to allow the outer peripheral portion 17 to remain between the opening 18 and the connector 15. The opening 18 can be formed by changing a mask pattern for lithography when the conductive layer 12 and the like are processed.

Figure 8:
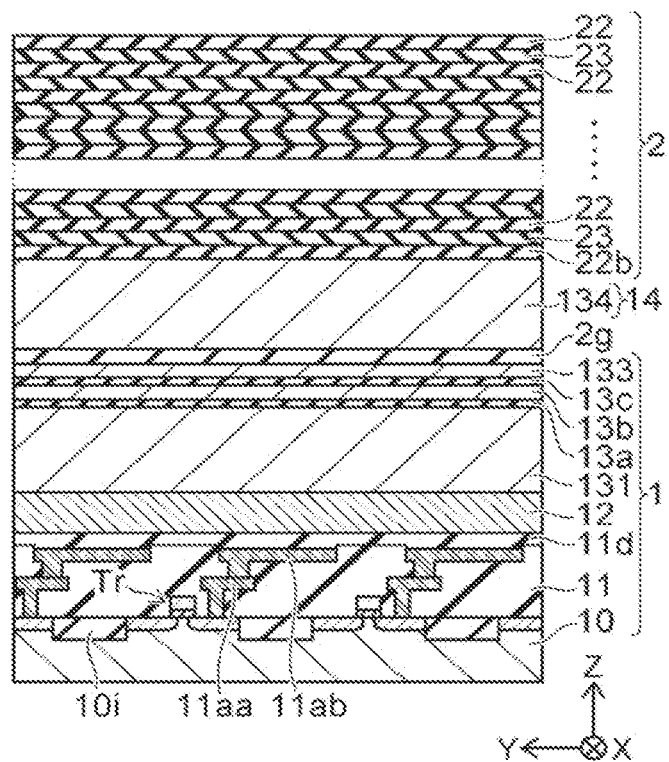
FIG. 8 is a cross-sectional view illustrating an example of a manufacturing method of a semiconductor storage device following FIG. 7.

Next, the insulation film 2g is formed on the semiconductor layer 133 as illustrated in FIG. 8. The insulation film 2g contains silicon oxide or metal oxide, for example. Next, the semiconductor layer 134 is formed on the insulation film 2g. The semiconductor layer 134 contains n-type doped silicon, for example. Accordingly, the semiconductor portion 14 is formed. Next, the insulation layer 22b is formed on the semiconductor layer 134. Subsequently, the sacrifice film 23 and the insulation layer 22 are alternately stacked on the insulation layer 22b. Each of the insulation layers 22 and 22b contains silicon oxide, for example. The sacrifice film 23 contains silicon nitride, for example. Accordingly, the base structure of the stack 2 during manufacturing is obtained, which is located in the Z-direction with respect to the conductive layer 12 and the like.

Next, the insulation layers 22 and the sacrifice films 23 are processed in a staircase pattern, thereby forming the staircase region (Staircase) in FIG. 3. The column portions CLHR are also formed.

Figure 9:
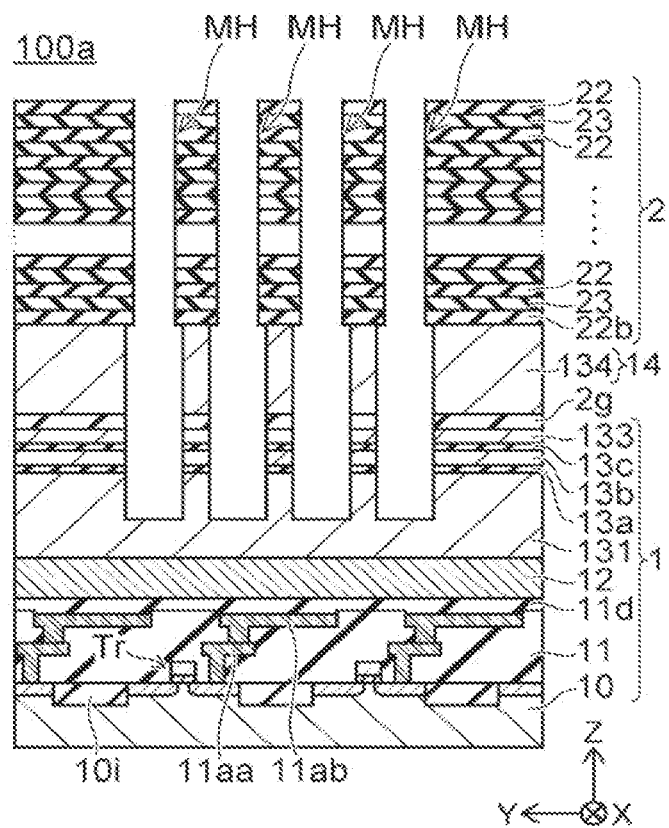
FIG. 9 is a cross-sectional view illustrating an example of a manufacturing method of a semiconductor storage device following FIG. 8.

Next, the stack 2, the semiconductor layer 134, the insulation film 2g, the semiconductor layer 133, the intermediate film 13c, the sacrifice film 13b, the intermediate film 13a, and the semiconductor layer 131 are subjected to anisotropic etching in the cell region (Cell), thereby forming the memory holes MH as illustrated in FIG. 9. The memory holes MH are formed from the top end of the stack 2 to the middle of the semiconductor layer 131. Isotropic etching may be performed for the semiconductor layer 134, the insulation film 2g, the semiconductor layer 133, the intermediate film 13c, the sacrifice film 13b, the intermediate film 13a, and the semiconductor layer 131 via the memory holes MH, to enlarge the diameter of the memory holes MH in a portion corresponding to the semiconductor portion 13 (for example, the semiconductor layer 131, the sacrifice film 13b, and the semiconductor layer 133) and in a portion corresponding to the semiconductor portion 14 (for example, the semiconductor layer 134).

When the memory holes MH are formed, charges are accumulated in the conductive layer 12 and the like. The charges flow to the ground in the outer peripheral portion of the semiconductor substrate 10 from the main body 19 of the conductive layer 12 and the like via the connector 15 and the outer peripheral portion 17, as described with reference to FIG. 7. Therefore, it is possible to prevent arcing between the conductive layer 12 and the like and the wire 11a below them in formation of the memory holes MH.

Figure 10:
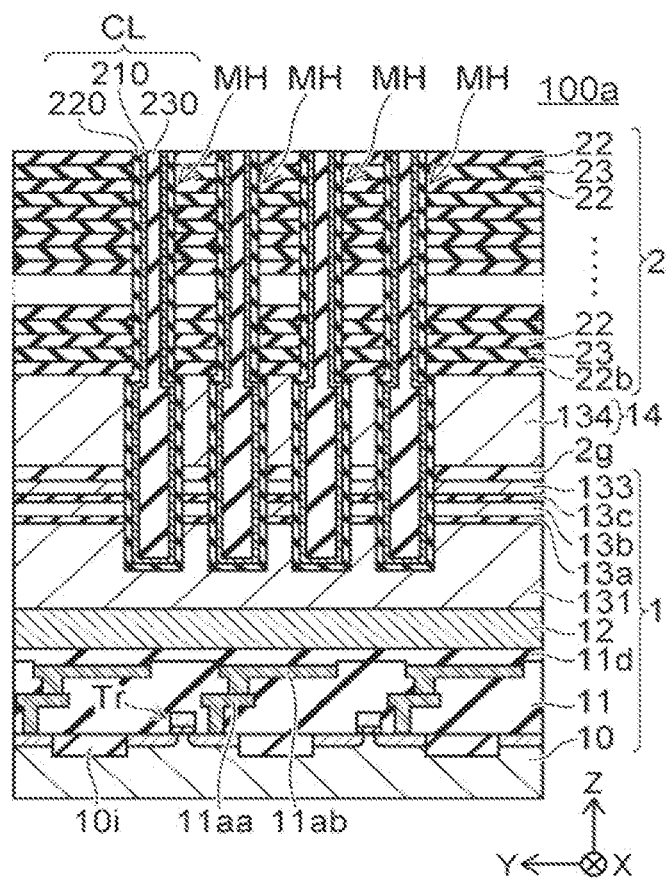
FIG. 10 is a cross-sectional view illustrating an example of a manufacturing method of a semiconductor storage device following FIG. 9.

Next, as illustrated in FIG. 10, the memory film 220 is formed in the memory holes MH. The memory film 220 contains silicon nitride and silicon oxide. Next, the semiconductor body 210 is formed on the memory film 220. The semiconductor layer 210 contains undoped silicon or p-type doped silicon, for example. Next, the core layer 230 is formed on the semiconductor body 210. The core layer 230 contains silicon oxide, for example. Accordingly, the memory holes MH are embedded with the semiconductor body 210, the memory film 220, and the core layer 230.

Figure 11:
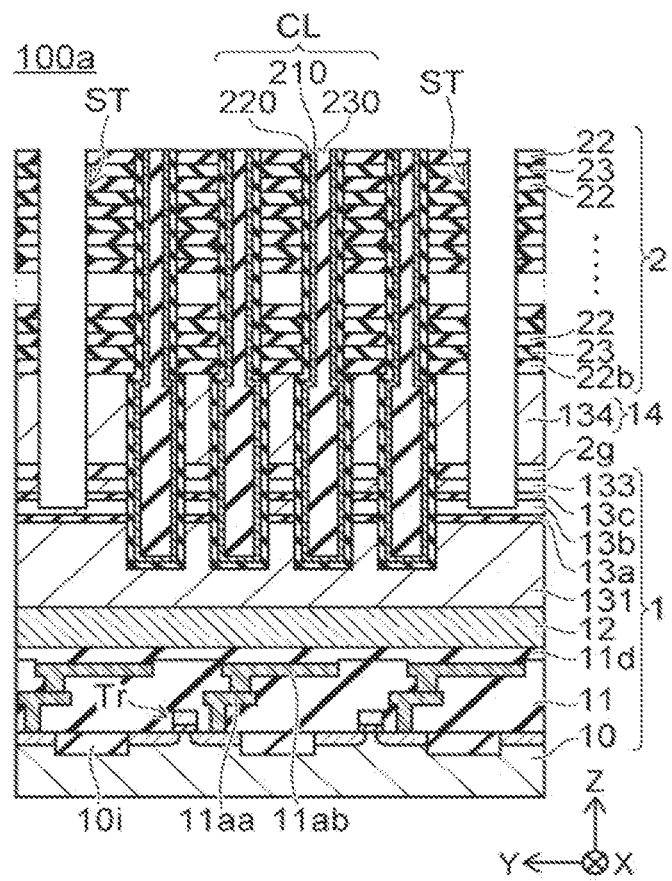
FIG. 11 is a cross-sectional view illustrating an example of a manufacturing method of a semiconductor storage device following FIG. 10.

Next, the stack 2, the semiconductor layer 134, the insulation film 2g, the semiconductor layer 133, the intermediate film 13c, and the sacrifice film 13b are subjected to anisotropic etching, thereby forming the deep slits ST as illustrated in FIG. 11. The deep slits ST are formed from the top end of the stack 2 to the middle of the sacrifice film 13b.

Also in formation of the deep slits ST, charges are accumulated in the conductive layer 12 and the like. The charges flow to the ground in the outer peripheral portion of the semiconductor substrate 10 from the main body 19 of the conductive layer 12 and the like via the connector 15 and the outer peripheral portion 17, as in formation of the memory holes MH. Therefore, it is possible to prevent arcing between the conductive layer 12 and the like and the wire 11a below them in formation of the deep slits ST.

Figure 12:
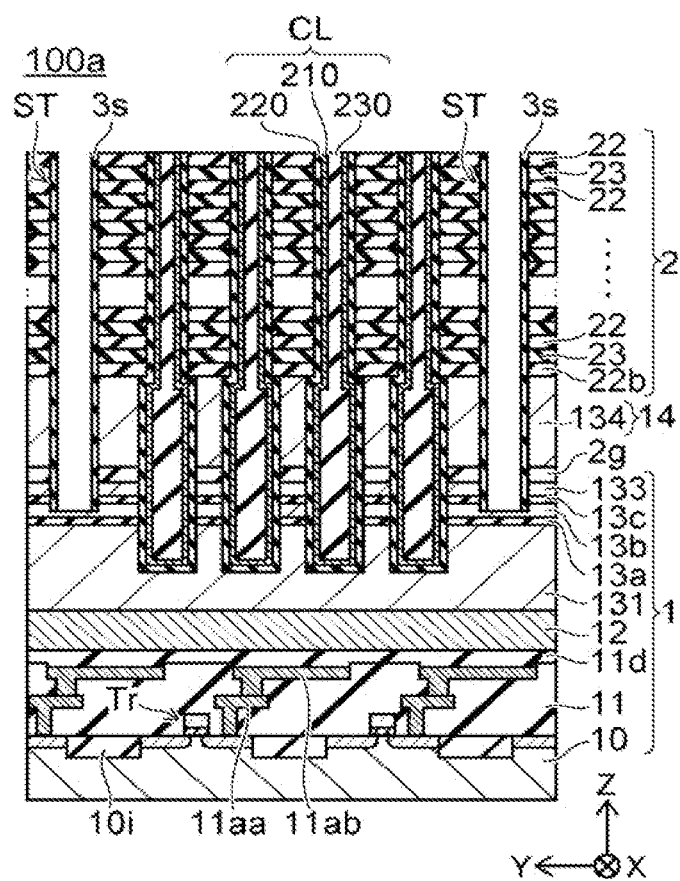
FIG. 12 is a cross-sectional view illustrating an example of a manufacturing method of a semiconductor storage device following FIG. 11.

Next, a stopper film 3s is formed on sidewalls of the deep slits ST as illustrated in FIG. 12. The stopper film 3s contains silicon nitride, for example.

Figure 13:
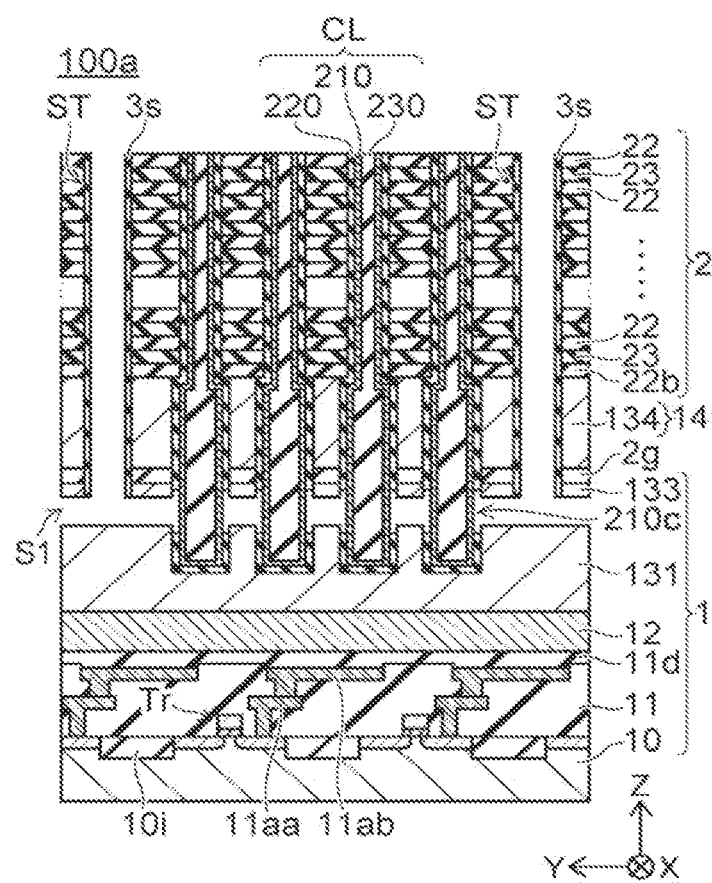
FIG. 13 is a cross-sectional view illustrating an example of a manufacturing method of a semiconductor storage device following FIG. 12.

Next, isotropic etching is performed for the sacrifice film 13b via the deep slits ST, thereby removing the sacrifice film 13b as illustrated in FIG. 13. In this isotropic etching, an etchant is selected which enables n-type doped silicon or undoped silicon to be etched faster than silicon oxide and silicon nitride, for example. A space S1 is thus formed between the intermediate film 13a and the intermediate film 13c. Further, isotropic etching is performed for the cover insulation film 221 (FIGS. 2A and 2B) of the memory film 220 via the deep slits ST, thereby removing the cover insulation film 221. In this isotropic etching, an etchant is selected which enables silicon oxide to be etched faster than silicon nitride, for example. Next, isotropic etching is performed for the charge trapping film 222 (FIGS. 2A and 2B) of the memory film 220 via the deep slits ST, thereby removing the charge trapping film 222. In this isotropic etching, an etchant is selected which enables silicon nitride to be etched faster than silicon oxide, for example. Next, the tunnel insulation film 223 (FIGS. 2A and 2B) of the memory film 220 is removed via the deep slits ST. The intermediate film 13a and the intermediate film 13c are also removed in this process. In this isotropic etching, an etchant is selected which enables silicon oxide to be etched faster than silicon nitride, for example. Accordingly, the space 51 is enlarged to between the semiconductor layer 131 and the semiconductor layer 133, and the semiconductor body 210 is exposed to the space 51 in the column portion CL. A portion where semiconductor body 210 is exposed serves as a contact portion 210c.

Figure 14:
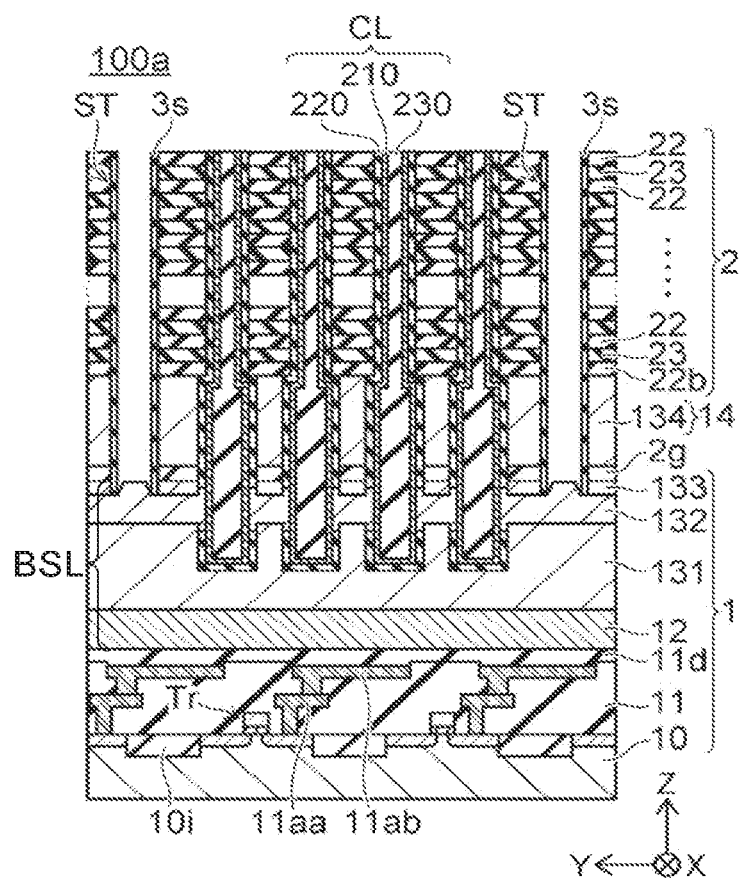
FIG. 14 is a cross-sectional view illustrating an example of a manufacturing method of a semiconductor storage device following FIG. 13.

Next, the space 51 is embedded with semiconductor via the deep slits ST, thereby forming the semiconductor layer 132 as illustrated in FIG. 14. The semiconductor layer 132 is an n-type doped silicon layer, for example. Accordingly, the conductive layer 12 and the semiconductor layers 131 to 133 are formed as the buried source layer BSL.

Figure 15:
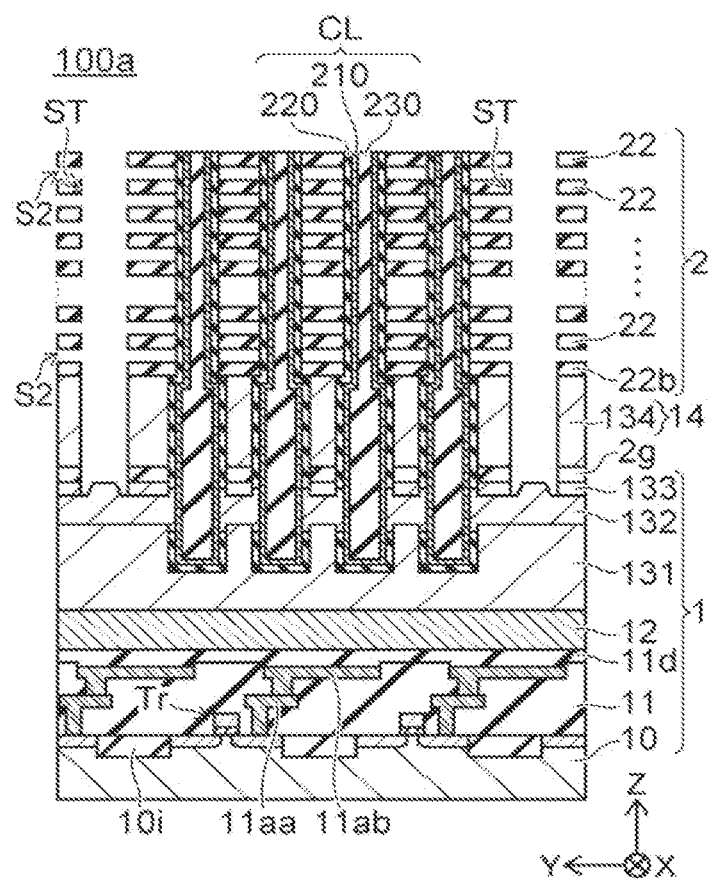
FIG. 15 is a cross-sectional view illustrating an example of a manufacturing method of a semiconductor storage device following FIG. 14.

Next, isotropic etching is performed for the stopper film 3s and the sacrifice films 23 via the deep slits ST, thereby removing the stopper film 3s and the sacrifice films 23 as illustrated in FIG. 15. Accordingly, a space S2 is formed between the insulation layers 22. In this isotropic etching, an etchant is selected which enables silicon nitride to be etched faster than silicon oxide and polysilicon, for example.

Figure 16:
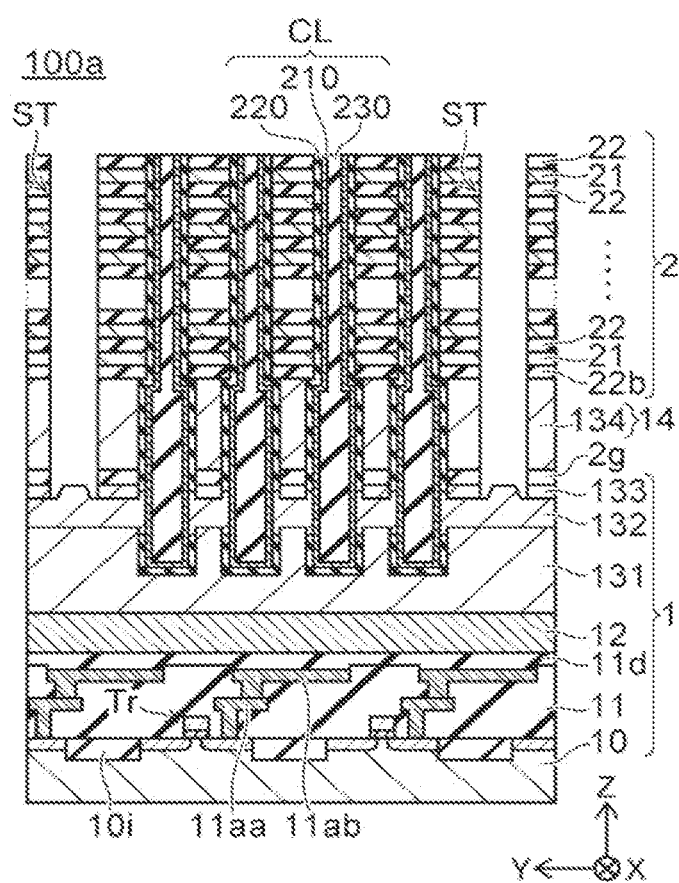
FIG. 16 is a cross-sectional view illustrating an example of a manufacturing method of a semiconductor storage device following FIG. 15.

Next, the space S2 is embedded with a conductor via the deep slits ST, thereby forming the electrode films 21 as illustrated in FIG. 16. The electrode films 21 contain tungsten, for example.

Next, the deep slits ST are embedded with an insulator, thereby forming the plate-shaped portion 3 as illustrated in FIG. 17. The plate-shaped portion 3 contains silicon oxide, for example.

Next, as illustrated in FIG. 1A, the electrode films 21 and the insulation layers 22 in an upper portion of the stack 2 are etched in the stacking direction of the stack 2 (the Z-direction) by lithography and etching in order to form the shallow slits SHE. The shallow slits SHE are embedded with an insulation film, so that the plate-shaped portion 4 in FIG. 1B is formed.

A trench is formed to penetrate through the connector 15, and is then embedded with an insulation material such as silicon oxide as illustrated in FIG. 5. Accordingly, the insulation member (the seal ring) 25 is formed. By forming the insulation member 25, the main body 19 and the outer peripheral portion 17 are electrically isolated from each other.

Thereafter, although not illustrated in the drawings, an interlayer dielectric film, a contact plug, the bit lines BL, and the like are formed above the stack 2 in accordance with a known method.

Next, the semiconductor substrate 10 in the form of a wafer is subjected to dicing along a dicing line DL illustrated in FIG. 7 by blade dicing or laser dicing. Accordingly, the semiconductor storage devices 100a are separated from each other into individual chips. In this dicing, film separation may occur from the outer peripheral portion 17. For example, the buried source layer BSL may be separated from the interlayer dielectric film 11 or 24 at the end 1e of the semiconductor chip in FIG. 5.

However, according to the present embodiment, the outer peripheral portion 17 of the conductive layer 12 and the like has the opening 18 in a connecting portion between the protrusion 15 and the outer peripheral portion 17. Accordingly, the film separation described above is limited in the opening 18, and it is possible to prevent propagation of the film separation from the outer peripheral portion 17 to the main body 19 via the protrusion 15.

Further, the opening 18 is provided over the entire thickness in the thickness direction of the outer peripheral portion 17 (the Z-direction). Therefore, it is possible to prevent both film separation between the buried source layer BSL and the interlayer dielectric film 11 below it and film separation between the buried source layer BSL and the interlayer dielectric film 24 above it. Further, the width W18 of the opening 18 is larger than the width W15 of the protrusion 15. Accordingly, the opening 18 can protect the entire protrusion 15 from propagation of film separation.

Meanwhile, as viewed in the Z-direction or the X-direction, the gap G is provided between the protrusion 15 and the opening 18. The protrusion 15 and the outer peripheral portion 17 are connected to each other by a conductive film of the buried source layer BSL in the gap G. During a manufacturing process, the outer peripheral portion 17 is located in the gap G between the opening 18 and the protrusion (the connector) 15 and is electrically connected to the main body 19. Accordingly, in formation of memory holes and slits, charges accumulated in the main body 19 can flow to the semiconductor substrate 10 via the protrusion 15 and the outer peripheral portion 17 in the gap G.

As described above, according to the present embodiment, the opening 18 can maintain electrical connection between the outer peripheral portion 17 and the main body 19, and can prevent propagation of film separation from the end 1e from the outer peripheral portion 17 to the protrusion 15 and the main body 19.

The opening 18 may also serve as an alignment pattern in lithography and the like in the above embodiment.

Second Embodiment

Figure 18:
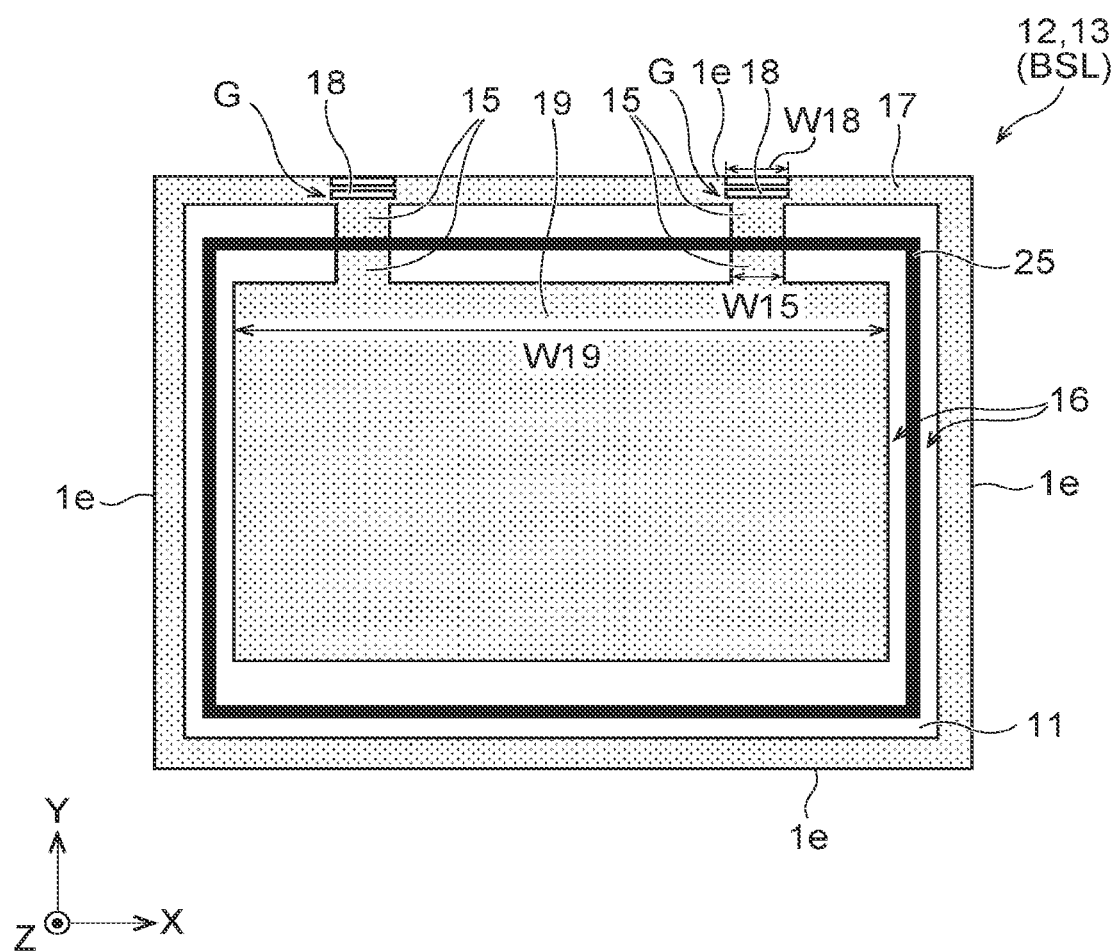
FIG. 18 is a plan view illustrating a configuration example of the buried source layer according to a second embodiment.

FIG. 18 is a plan view illustrating a configuration example of the buried source layer BSL according to a second embodiment. FIG. 18 illustrates a plane of the buried source layer BSL corresponding to the whole chip of the semiconductor storage device 100a.

The buried source layer BSL according to the second embodiment has the plural openings 18. The openings 18 each have the same configuration as that in the first embodiment and are arranged in the Y-direction that is directed from the main body 19 toward the outer peripheral portion 17 via the protrusion 15. It suffices that the openings 18 have the same size as each other.

By providing the plural openings 18, it is possible to prevent propagation of film separation from the outer peripheral portion 17 to the main body 19 via the protrusion 15 more surely. The rest of the configuration of the second embodiment can be identical to the corresponding configuration of the first embodiment. Therefore, the second embodiment can achieve effects identical to those of the first embodiment.

As described above, the number of the openings 18 is not limited to any specific number.

Figure 19:
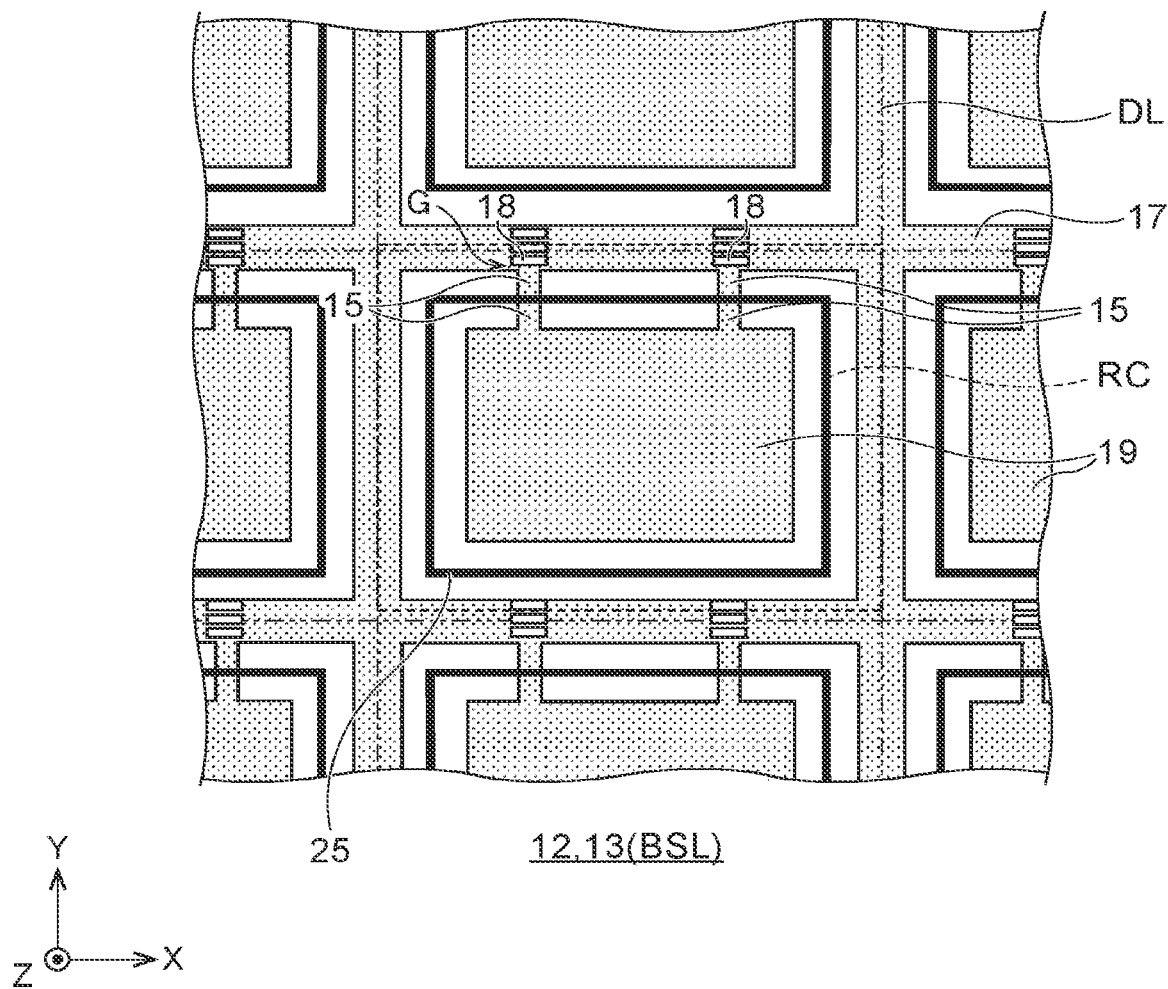
FIG. 19 is a plan view illustrating an example of the conductive layer and the like in the middle of manufacturing of the semiconductor storage device according to the second embodiment.

FIG. 19 is a plan view illustrating an example of the conductive layer 12 and the like in the middle of manufacturing of the semiconductor storage device 100a according to the second embodiment. The outer peripheral portion 17 has the plural openings 18 in a dicing region of a connecting portion between the protrusion 15 and the outer peripheral portion 17. The openings 18 are arranged in the Y-direction that is directed from the main body 19 toward the outer peripheral portion 17 via the protrusion 15. As described above, the plural openings 18 are provided in a semiconductor wafer before dicing. After dicing, two of the plural openings 18 are left, so that the buried source layer BSL according to the second embodiment can be formed. If one of the openings 18 is left by dicing, the buried source layer BSL according to the first embodiment can be formed.

As described above, in the present embodiment, the outer peripheral portion 17 may have the plural openings 18 in a dicing region of a connecting portion between the protrusion 15 and the outer peripheral portion 17.

Third Embodiment

Figure 20:
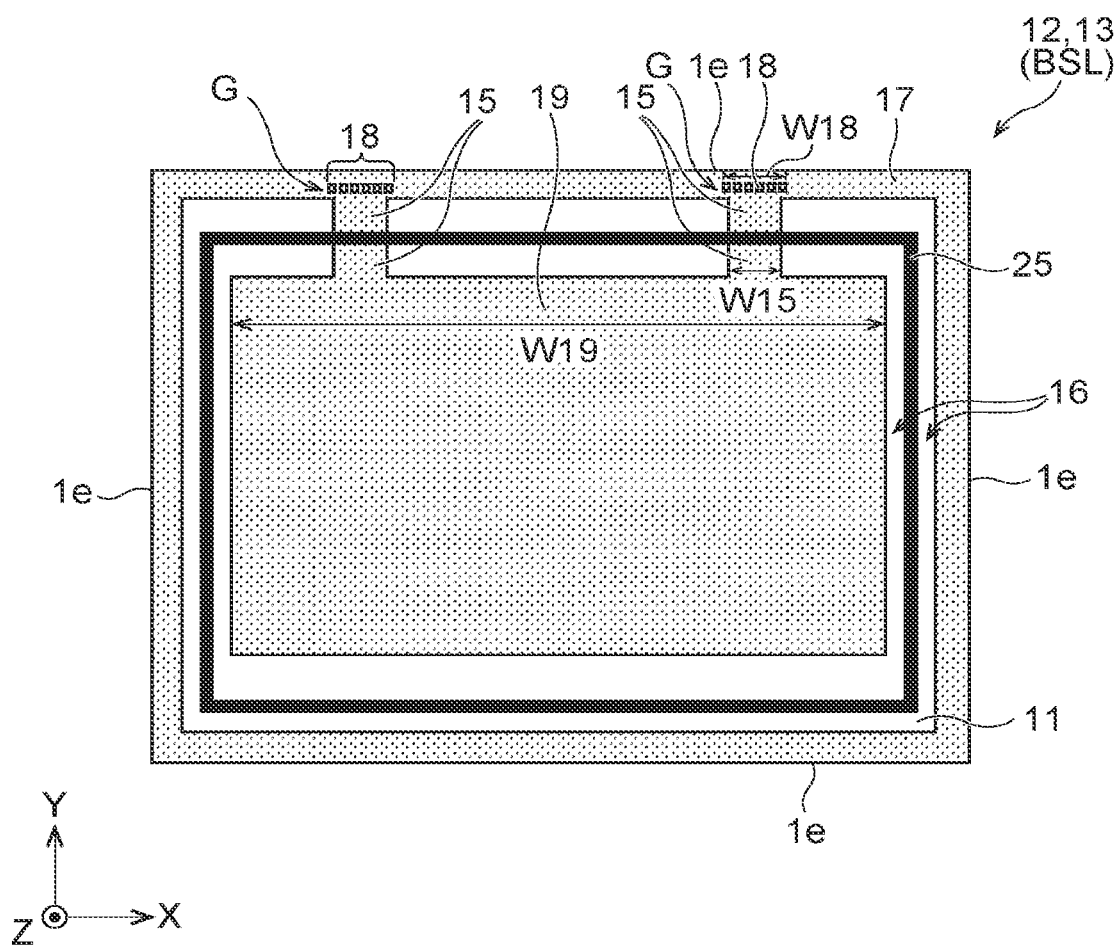
FIG. 20 is a plan view illustrating a configuration example of the buried source layer according to a third embodiment.

FIG. 20 is a plan view illustrating a configuration example of the buried source layer BSL according to a third embodiment. FIG. 20 illustrates a plane of the buried source layer BSL corresponding to the whole chip of the semiconductor storage device 100a.

According to the third embodiment, the opening 18 is formed by a plurality of dot patterns DT. The dot patterns DT as a plurality of holes are arranged in the X-direction over the width W18. The width W18 of the arrangement of the dot patterns DT is larger than the width W15 in the X-direction of the protrusion 15. Each dot pattern DT penetrates through the buried source layer BSL in its thickness direction (the Z-direction). The diameter of each dot pattern DT is about 1 μm or more, for example.

The material for the outer peripheral portion 17 is left between the dot patterns DT according to the third embodiment. The material for the outer peripheral portion 17 is also located between the dot patterns DT and the protrusion (the connector) 15. Therefore, even when electrical connection between the outer peripheral portion 17 in the gap G and the connector 15 is disconnected in formation of the slits ST or the memory holes MH in a manufacturing process, electrical connection between the outer peripheral portion 17 and the connector 15 can be maintained between the dot patterns DT.

Meanwhile, the dot patterns DT are arranged in a wider region than the width W15 of the protrusion 15 in the X-direction, as with the opening 18 according to the first embodiment. Accordingly, it is possible to prevent propagation of film separation from the outer peripheral portion 17 to the main body 19 via the protrusion 15.

The rest of the configuration of the third embodiment can be identical to the corresponding configuration of the first embodiment. Therefore, the third embodiment can achieve effects identical to those of the first embodiment.

The number of the arranged dot patterns DT is not specifically limited to any specific number. Therefore, the arrangement of the dot patterns DT according to the third embodiment may be applied in place of the openings 18 according to the second embodiment. In this manner, the third embodiment can be also applied to the second embodiment.

Fourth Embodiment

Figure 21:
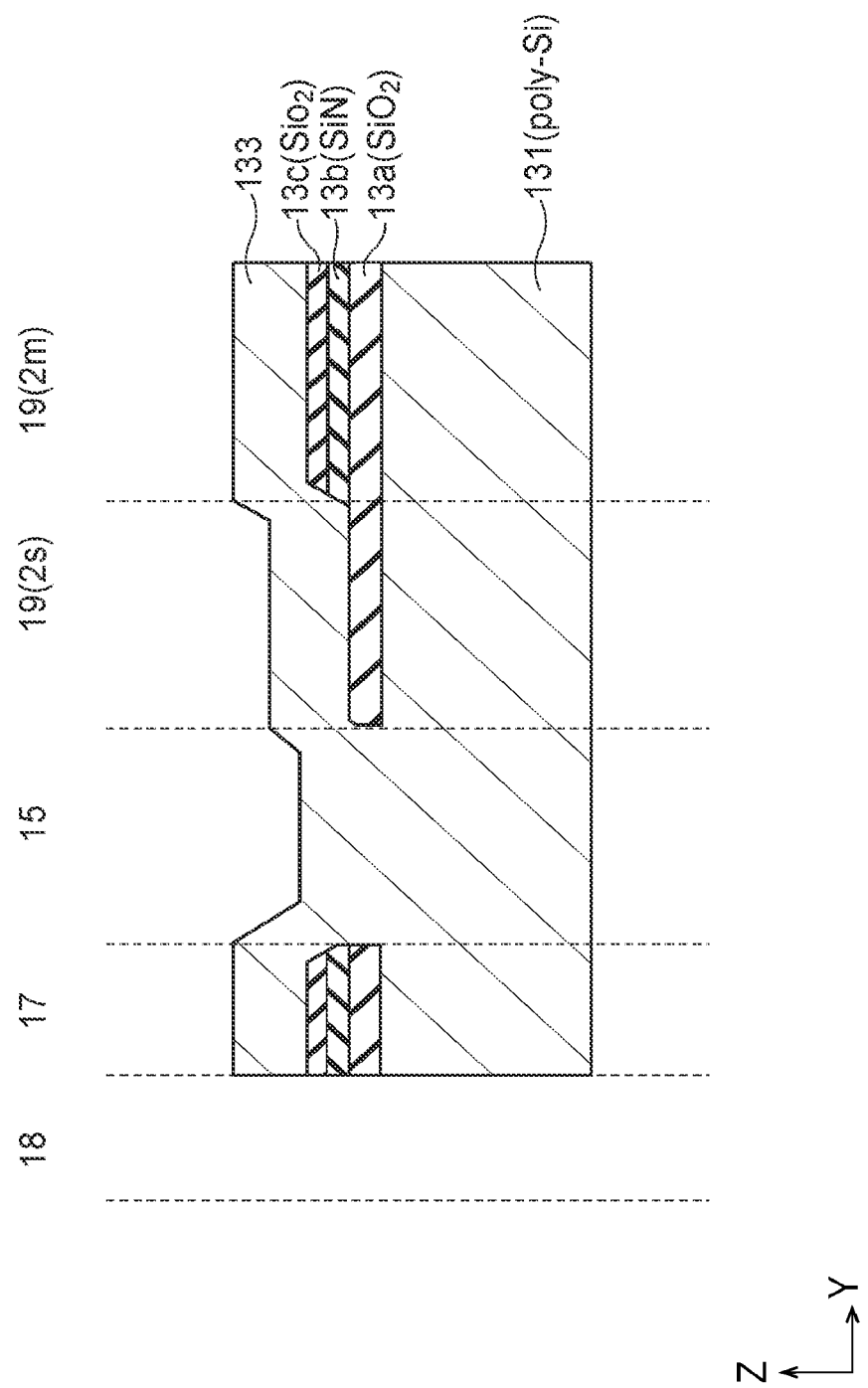
FIG. 21 is a cross-sectional view illustrating an example of the semiconductor layers, the intermediate films, and the sacrifice film in the middle of manufacturing of the semiconductor storage device according to a fourth embodiment.
Figure 22:
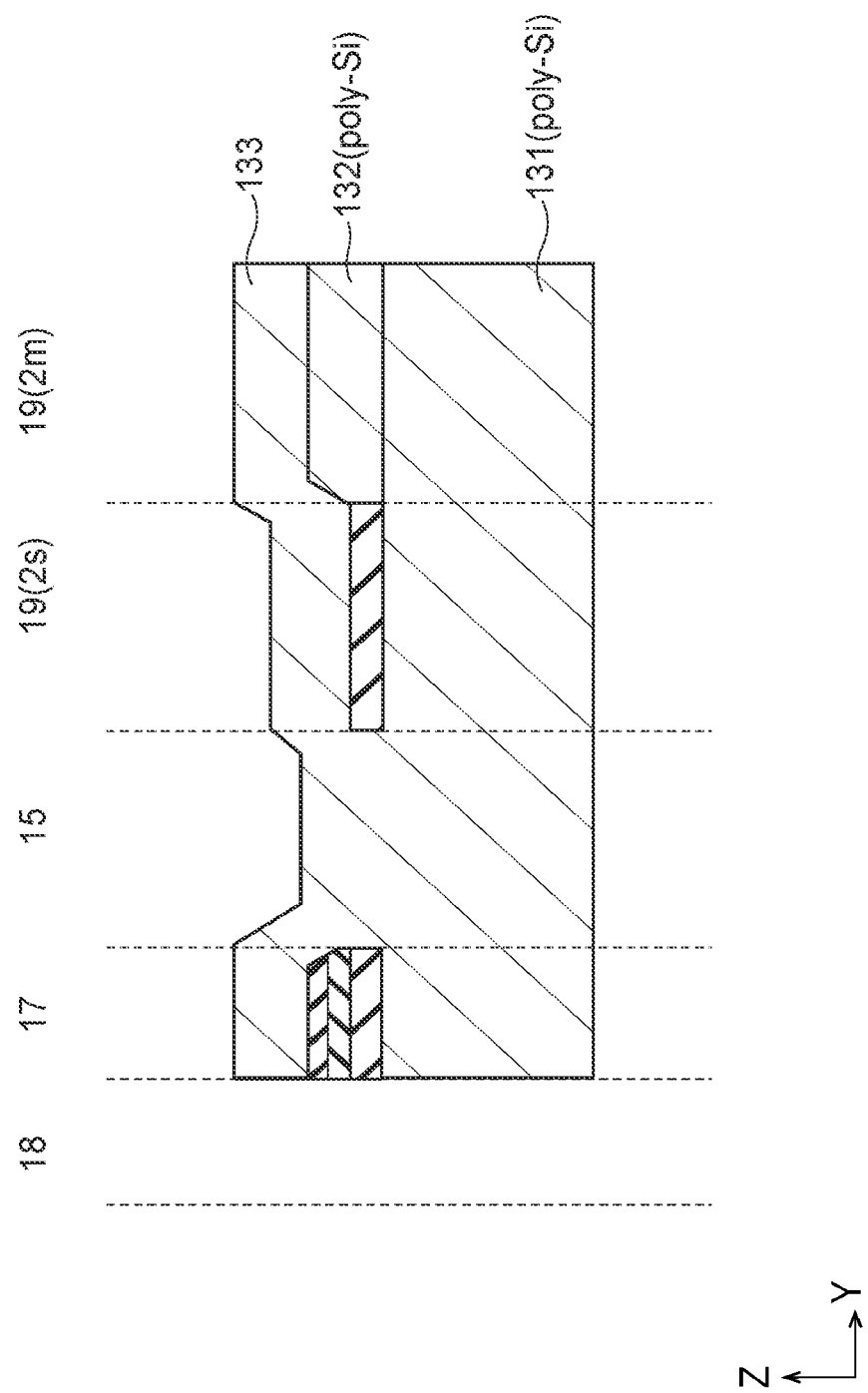
FIG. 22 is a cross-sectional view of the semiconductor storage device according to the fourth embodiment.

FIG. 21 is a cross-sectional view illustrating an example of the semiconductor layers 131 and 133, the intermediate films 13c and 13a, and the sacrifice film 13b in the middle of manufacturing of the semiconductor storage device 100a according to a fourth embodiment. FIG. 22 is a cross-sectional view of the semiconductor storage device 100a according to the fourth embodiment. FIGS. 21 and 22 illustrate a cross-section along a line C-C in FIG. 7. The configuration below the semiconductor layer 131 and the configuration above the semiconductor layer 133 have been as described above with reference to FIG. 8, and therefore the illustrations thereof are omitted here. FIG. 21 illustrates a cross-section including the main body 19, the protrusion (the connector) 15, the outer peripheral portion 17, and the opening 18. Doped polysilicon is used for the semiconductor layers 131 and 133, for example. For example, a silicon oxide film is used as each of the intermediate films 13c and 13a. For example, a silicon nitride film is used as the sacrifice film 13b.

In a region 19(2m) of the memory cell array 2m in the main body 19, the semiconductor layer 131, the intermediate film 13a, the sacrifice film 13b, the intermediate film 13c, and the semiconductor layer 133 are stacked in this order. The intermediate film 13a, the sacrifice film 13b, and the intermediate film 13c are replaced with the semiconductor layer 132 in a later process, as described above.

In a region 19(2s) of the staircase portion 2s in the main body 19, the semiconductor layer 131, the intermediate film 13a and the semiconductor layer 133 are stacked in this order. In the region 19(2s), the sacrifice film 13b is omitted.

In the connector 15, the semiconductor layer 131 and the semiconductor layer 133 are stacked in this order. In the connector 15, the intermediate films 13a and 13c and the sacrifice film 13b are omitted. With this configuration, the semiconductor layers 131 and 133 are connected to each other and are electrically integrated together. Because of integration of the semiconductor layers 131 and 133, the resistance of the connector 15 becomes low, and charges in formation of the slits ST or the memory holes MH can easily pass through the connector 15 during a manufacturing process.

The outer peripheral portion 17 has an identical configuration to that of the region 19(2m). That is, the semiconductor layer 131, the intermediate film 13a, the sacrifice film 13b, the intermediate film 13c, and the semiconductor layer 133 are stacked in this order.

In the opening 18, the semiconductor layer 131, the intermediate film 13a, the sacrifice film 13b, the intermediate film 13c, and the semiconductor layer 133 are etched and removed. A film such as a silicon oxide film is filled in the opening 18.

The connector 15 is a portion that connects the main body 19 and the outer peripheral portion 17 to each other, as illustrated in FIG. 7, is narrower than the main body 19 and the outer peripheral portion 17, and is in a high-resistance state. In formation of the slits ST or the memory holes MH, charges can easily concentrate in this connector 15 and therefore arcing can easily occur.

Meanwhile, according to the fourth embodiment, the semiconductor layers 131 and 133 are connected to each other and are electrically integrated together in the connector 15. Therefore, the connector 15 is narrower than the main body 19 and the outer peripheral portion 17, but is substantially thick in the thickness direction (the Z-direction). That is, the connector 15 is thicker and has a lower resistance than a single layer of the semiconductor layer 131. Accordingly, in formation of the slits ST or the memory holes MH, it is possible to reduce concentration of charges in the connector 15 and to prevent arcing.

Although it can be considered to increase the width W15 in the X-direction of the connector 15, a dicing region usually includes various patterns, for example, an alignment pattern, and a test pattern (TEG (Test Element Group) pattern). Therefore, it is not easy to increase the width W15 in the X-direction of the connector 15, and there are various restrictions.

Meanwhile, in the connector 15 according to the fourth embodiment, the intermediate films 13a and 13c and the sacrifice film 13b are omitted, the semiconductor layers 131 and 133 are connected to each other, and the connector 15 is made thicker in the thickness direction. Accordingly, it is possible to reduce the resistance of the connector 15 without increasing the width W15 thereof.

Thereafter, the intermediate films 13a and 13c and the sacrifice film 13b are replaced with the semiconductor layer 132, as illustrated in FIG. 22, by the steps described with reference to FIGS. 11 to 14. The semiconductor layer 132 is an n-type doped silicon layer, for example, as with the semiconductor layers 131 and 133. The semiconductor layers 131 to 133 are formed as the buried source layer BSL.

Thereafter, the semiconductor storage device 100a is completed by the steps described with reference to FIGS. 15 to 17.

Fifth Embodiment

Figure 23:
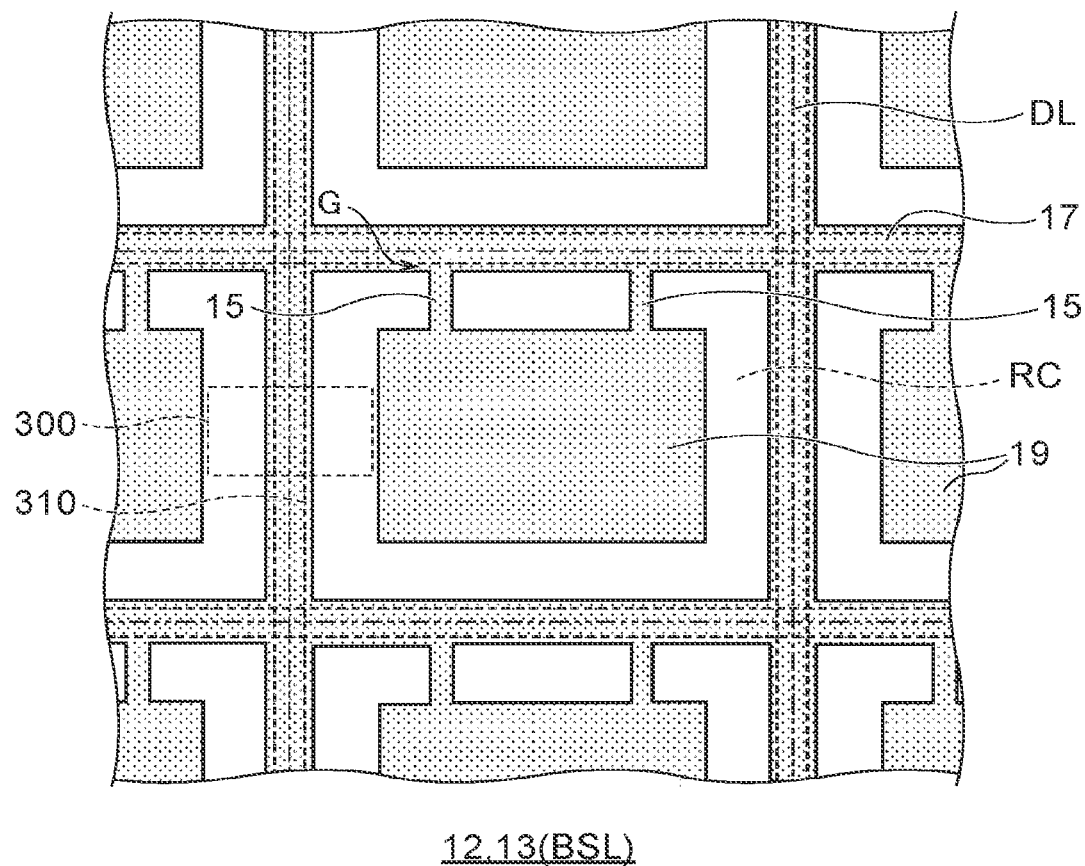
FIG. 23 is a plan view illustrating an example of the conductive layer and the like according to a fifth embodiment.

FIG. 23 is a plan view illustrating an example of the conductive layer 12 and the like according to a fifth embodiment. In the fifth embodiment, the opening 18 is not provided in the outer peripheral portion 17. Meanwhile, slits 310 are provided in the outer peripheral portion 17 to extend along an outer edge of each semiconductor chip. The slits 310 may be provided over the entire outer circumference of the semiconductor chip, but are not provided in a mark region RM (FIG. 24) that has an alignment mark. The rest of the configuration of the fifth embodiment can be identical to the corresponding configuration of any of the first to fourth embodiments.

Figure 24:
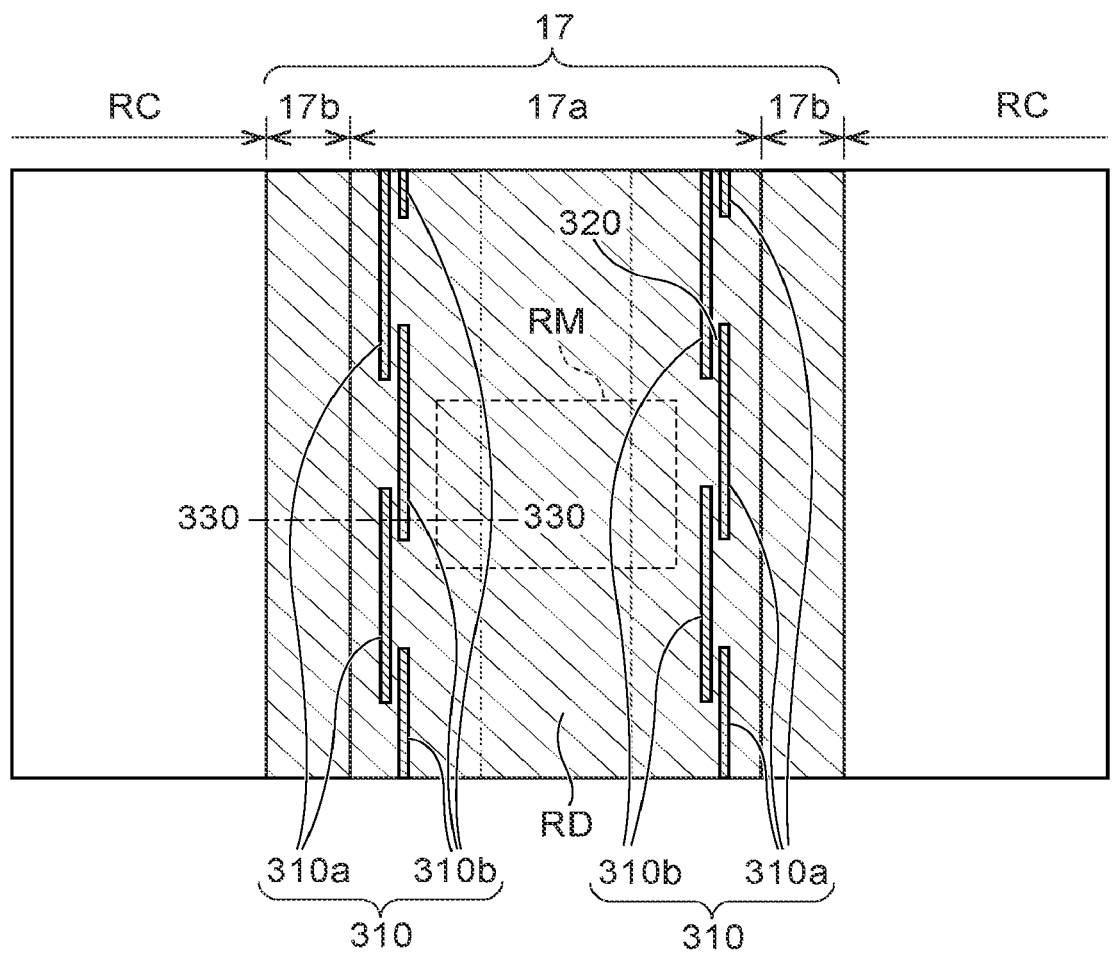
FIG. 24 is an enlarged plan view of a region surrounded by a broken line frame in FIG. 23.

FIG. 24 is an enlarged plan view of a region surrounded by a broken line frame 300 in FIG. 23. The slits 310 include slits 310a and slits 310b. The outer peripheral portion 17 includes a kerf region 17a including a dicing region RD and an edge seal region 17b. The slit 310a as a first slit and the slit 310b as a second slit are provided in the kerf region 17a of the outer peripheral portion 17 alternately (in a staggered manner). That is, the slits 310a and 310b are arranged in a zigzag pattern or a checkered pattern in plan view as viewed in the Z-direction. The alternately arranged slits 310a and 310b are provided on both sides of the dicing region RD in lines.

In plan view as viewed in the Z-direction, the slits 310a and 310b are apart from each other, and a connector 320 is provided between the slit 310a and the slit 310b. The connector 320 is provided between the slit 310a and the slit 310b and is made of the same material as the conductive layer 12 and the like as a portion of the conductive layer 12 and the like. The connector 320 electrically connects the conductive layer 12 and the like on the edge seal region 17b side (the main body 19 side) of the linearly arranged slits 310a and 310b and the conductive layer 12 and the like on the dicing region RD side of the slits 310a and 310b to each other. The connector 320 electrically connects the kerf region 17a and the edge seal region 17b on both sides thereof to each other. Accordingly, in formation of the memory holes MH and the slits ST, charges accumulated in the main body 19 can flow to the semiconductor substrate 10 via the outer peripheral portion 17 including the edge seal regions 17b, the connectors 320, and the kerf region 17a.

The connectors 320 between the slits 310a and 310b overlap each other as viewed in the X-direction that is directed from the main body 19 of a semiconductor chip toward the outer peripheral portion 17. Accordingly, while the slits 310a and 310b maintain electrical connection between the kerf region 17a and the edge seal regions 17b, the film separation described above from the dicing region RD is limited in the slits 310a and 310b, and it is possible to prevent propagation of the film separation from the outer peripheral portion 17 to the main body 19.

Figure 25:
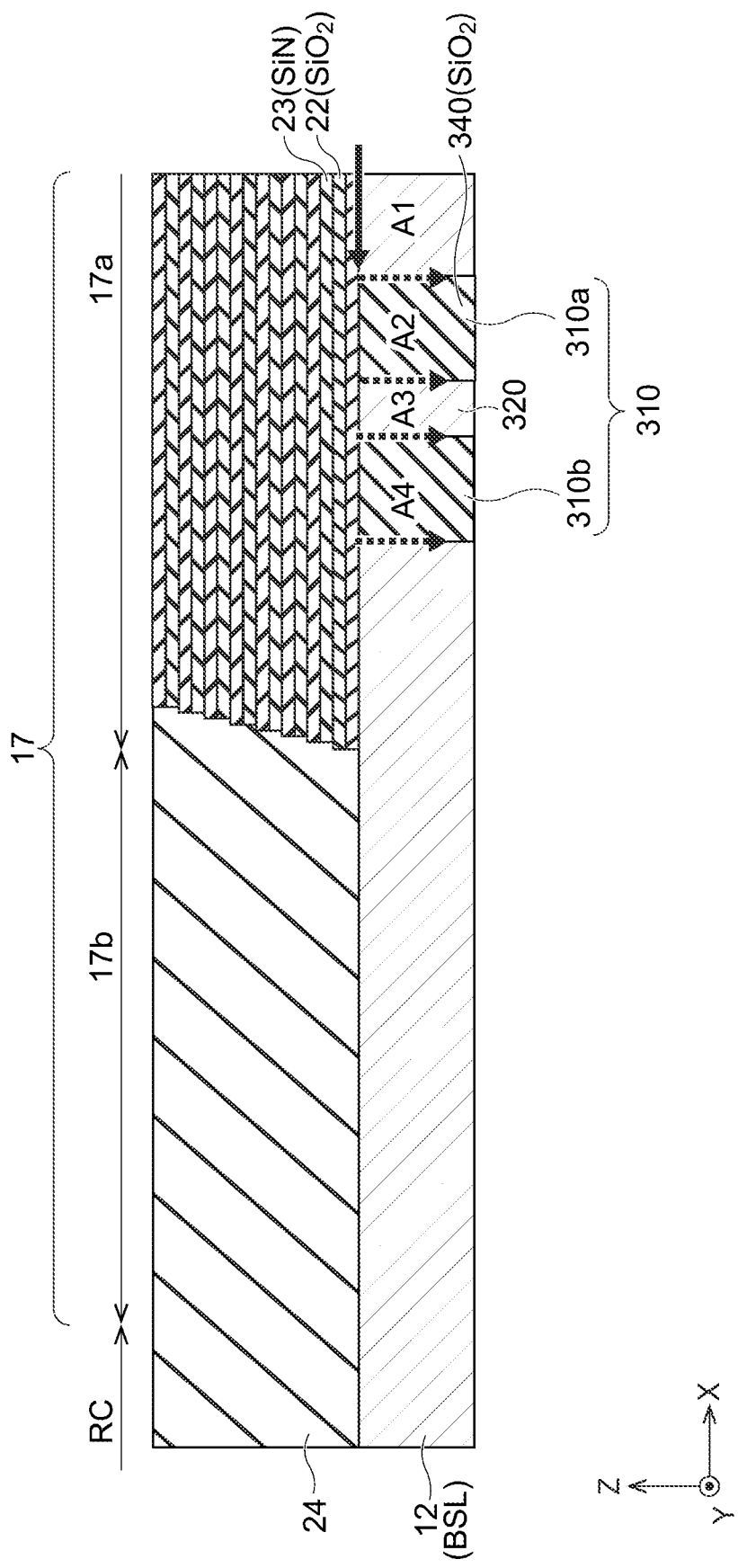
FIG. 25 is a cross-sectional view along a line 330-330 in FIG. 24.

FIG. 25 is a cross-sectional view along a line 330-330 in FIG. 24. The slits 310*a* and 310*b* are provided in the conductive layer 12 and the like in the kerf region 17*a*. The slits 310*a* and 310*b* are filled with the same insulating material (for example, a silicon oxide film) 340 as the insulation layer 22. The connector 320 is provided between the slit 310*a* and the slit 310*b*.

A stacked structure of the insulation layers 22 and the sacrifice films 23 (an ONON stacked structure) is provided on the slits 310*a* and 310*b*. The interlayer dielectric film 24 is provided on the conductive layer 12 and the like in the edge seal region 17*b*. In the kerf region 17*a*, in a case where the stacked structure of the insulation layers 22 and the sacrifice films 23 is provided on the conductive layer 12 and the like, film separation can easily occur between the stacked structure and the conductive layer 12 and the like, as indicated with a solid arrow in FIG. 25.

However, in the present embodiment, the slits 310*a* and 310*b* are provided, and the insulation film 340 is filled in them. Therefore, even when film separation occurs between the stacked structure and the conductive layer 12 and the like, that film separation grows in the −Z-direction along one side surface of the slit 310*a* between the insulation film 340 and the conductive layer 12 and the like, as indicated with an arrow A1. Further, even when film separation grows in the -X-direction between the stacked structure and the insulation film in the slit 310*a*, that film separation grows in the −Z-direction along the other side surface of the slit 310*a*, as indicated with an arrow A2. Furthermore, even when film separation grows in the −X-direction between the stacked structure and the connector 320, that film separation grows in the −Z-direction along one side surface of the slit 310*b* between the insulation film 340 and the conductive layer 12 and the like, as indicated with an arrow A3. Even when film separation grows in the −X-direction between the stacked structure and an insulation film in the slit 310*b*, that film separation grows in the −Z-direction along the other side surface of the slit 310*b*, as indicated with an arrow A4. As described above, according to the present embodiment, even when film separation occurs between the stacked structure of the insulation layers 22 and the sacrifice films 23 and the conductive layer 12 and the like in the ±X-direction, it is possible to guide the film separation in any of the directions illustrated with the arrows A1 to A4 (the −Z-direction) by the slits 310*a* and 310*b*, thereby preventing growth of the film separation toward the edge seal region 17*b* or the chip region RC.

Only either one of the slits 310*a* and 310*b* may be provided. Alternatively, three or more slits may be provided in the conductive layer 12 and the like.

In FIG. 25, the stacked structure of the insulation layers 22 and the sacrifice films 23 (the ONON stacked structure) is provided on the slits 310*a* and 310*b*. However, the interlayer dielectric film 24 may be provided on the slits 310*a* and 310*b*, as in the edge seal region 17*b*. Also in this case, it is possible to prevent growth of film separation toward the edge seal region 17*b* or the chip region RC by the slits 310*a* and 310*b*.

Figure 26:
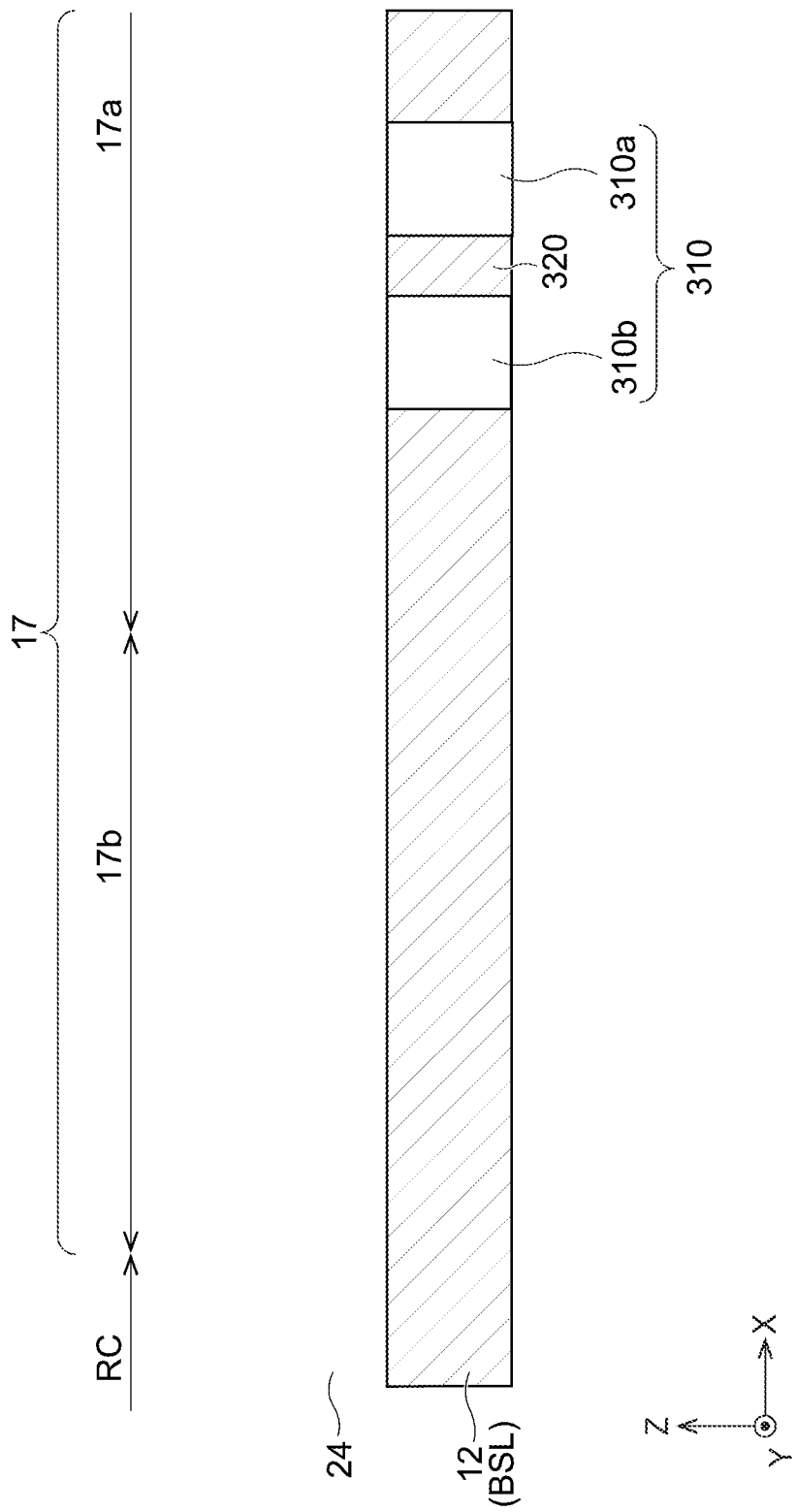
FIG. 26 is a cross-sectional view illustrating an example of a manufacturing method according to the fifth embodiment.
Figure 27:
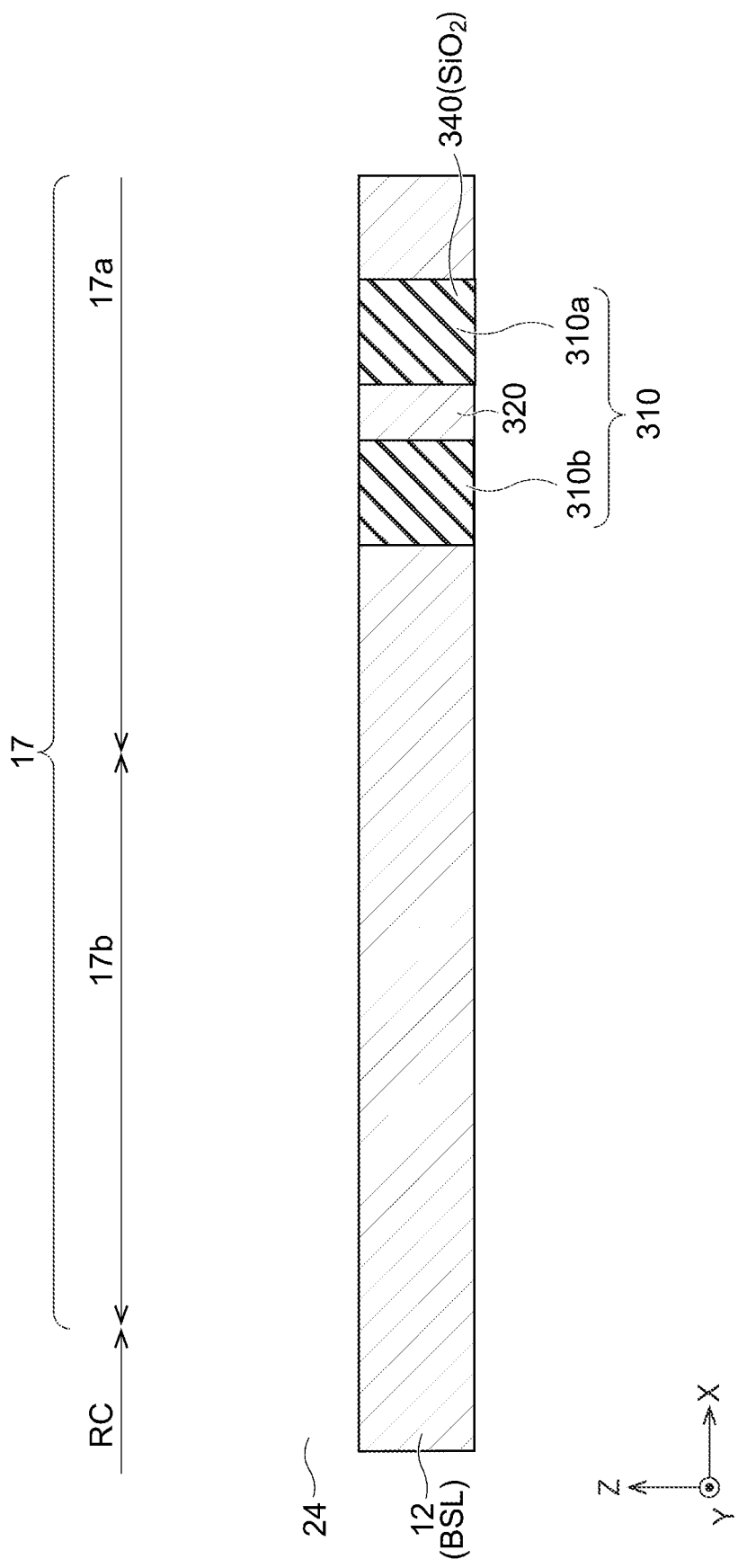
FIG. 27 is a cross-sectional view illustrating an example of a manufacturing method according to the fifth embodiment.
Figure 28:
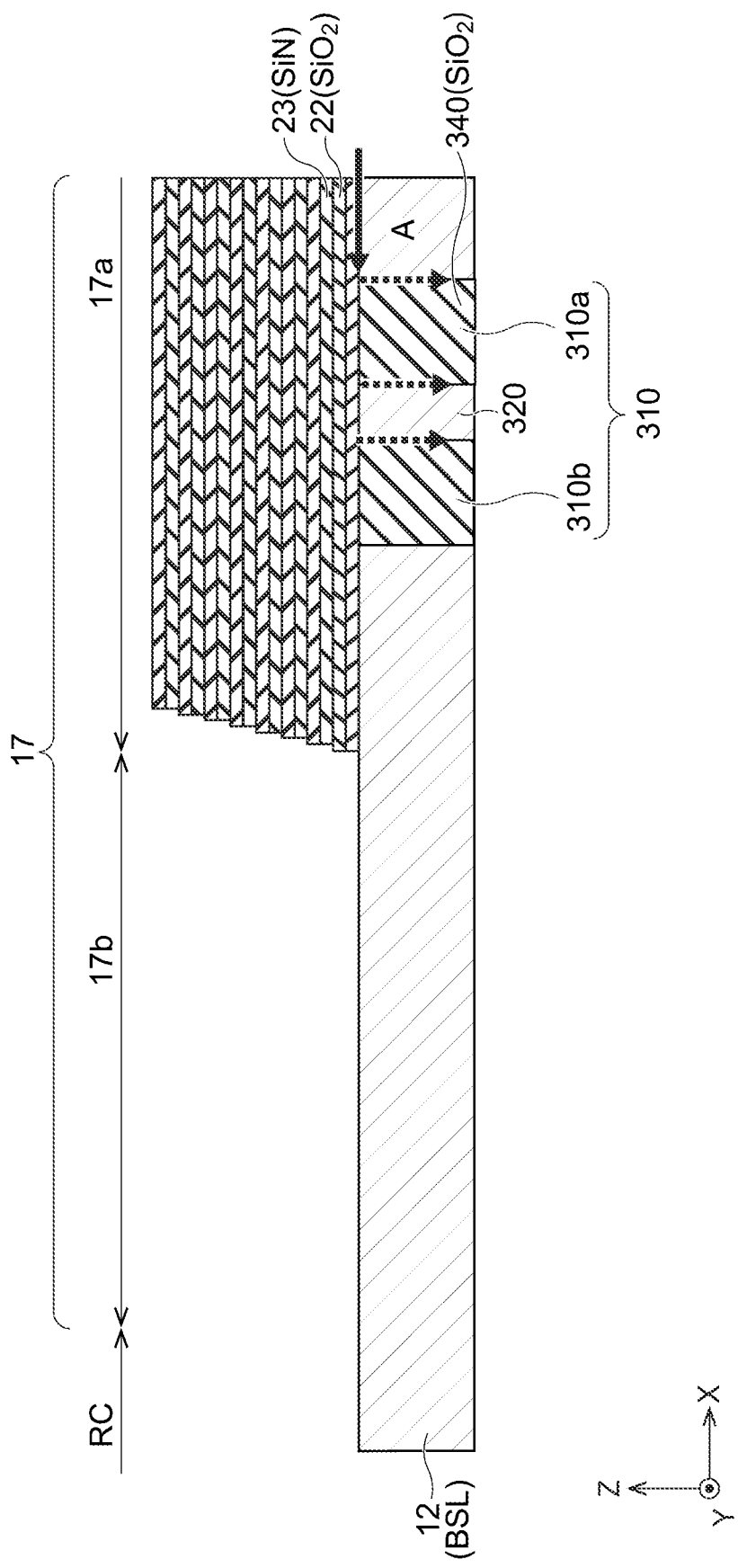
FIG. 28 is a cross-sectional view illustrating an example of a manufacturing method according to the fifth embodiment.

FIGS. 26 to 28 are cross-sectional views illustrating an example of a manufacturing method according to the fifth embodiment.

First of all, the manufacturing method is identical to those in other embodiments before forming the conductive layer 12 and the like. When the conductive layer 12 and the like are processed by lithography and etching, the slits 310*a* and 310*b* are formed in the kerf region 17*a*. With this process, the structure illustrated in FIG. 26 is obtained.

Next, the slits 310*a* and 310*b* are embedded with the insulation film 340 as illustrated in FIG. 27. The insulation film 340 may be the same as the insulation film 2*g* described above.

After the insulation film 340 is flattened, the sacrifice film 23 and the insulation layer 22 are alternately stacked as described with reference to FIG. 8, thereby forming a stacked structure (for example, an ONON stacked structure). Next, the insulation layers 22 and the sacrifice films 23 are processed in a staircase pattern, thereby forming a staircase region. At this step, although the insulation layers 22 and the sacrifice films 23 are removed in the edge seal region 17*b*, the stacked structure in the kerf region 17*a* is left as illustrated in FIG. 28. Therefore, the stacked structure of the insulation layers 22 and the sacrifice films 23 is provided on the slits 310*a* and 310*b*.

Thereafter, the interlayer dielectric film 24 illustrated in FIG. 25 is formed on the edge seal region 17*b* by the steps described with reference to FIGS. 9 to 17, so that the semiconductor storage device 100*a* according to the present embodiment is completed.

Sixth Embodiment

Figure 29:
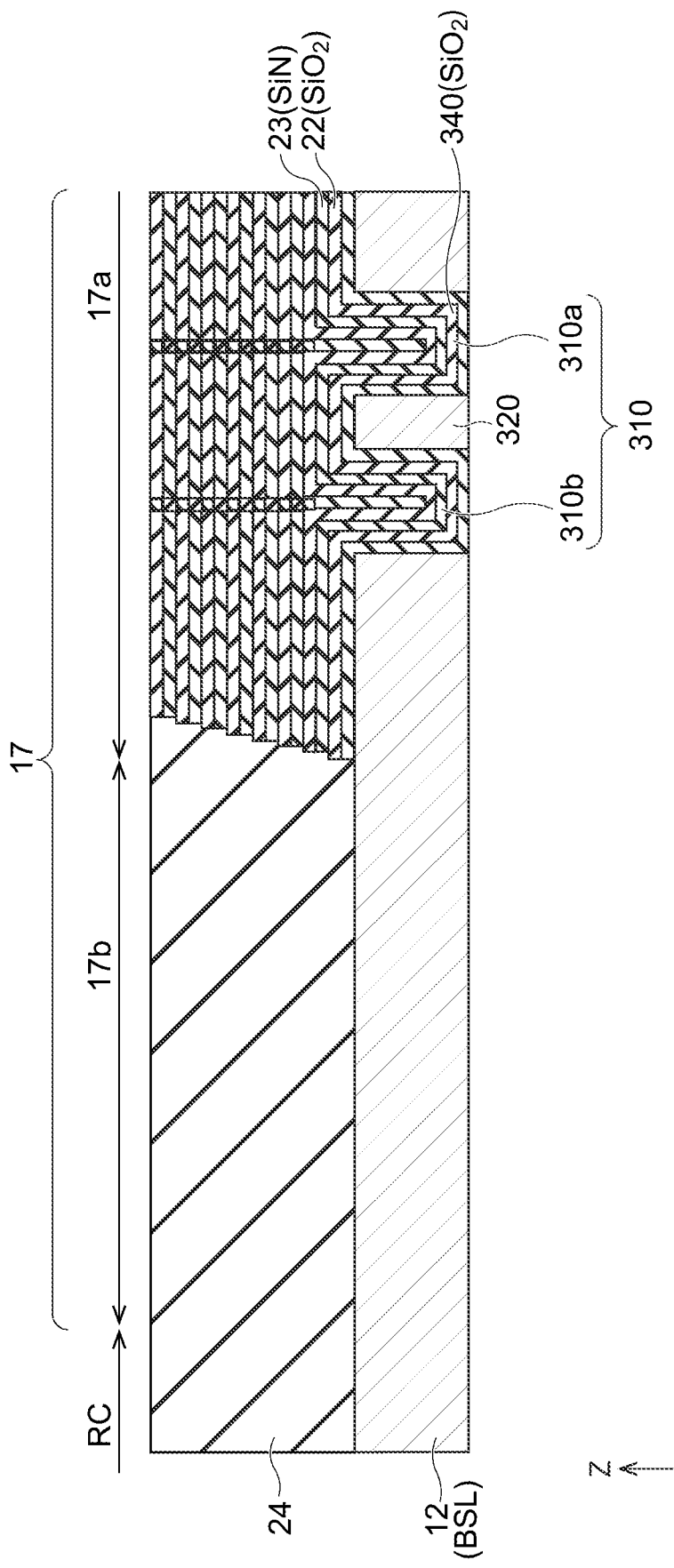
FIG. 29 is a cross-sectional view illustrating an example of the conductive layer and the like according to a sixth embodiment.

FIG. 29 is a cross-sectional view illustrating an example of the conductive layer 12 and the like according to a sixth embodiment. In the sixth embodiment, a stacked structure of the insulation layers 22 and the sacrifice films 23 is filled in the slits 310*a* and 310*b*. In association with this configuration, layers are shifted from the stacked structure of the insulation layers 22 and the sacrifice films 23 on the slits 310*a* and 310*b*. However, this shift does not affect the characteristics of the semiconductor storage device 100*a*. The rest of the configuration of the sixth embodiment can be identical to the corresponding configuration of the fifth embodiment.

Figure 30:
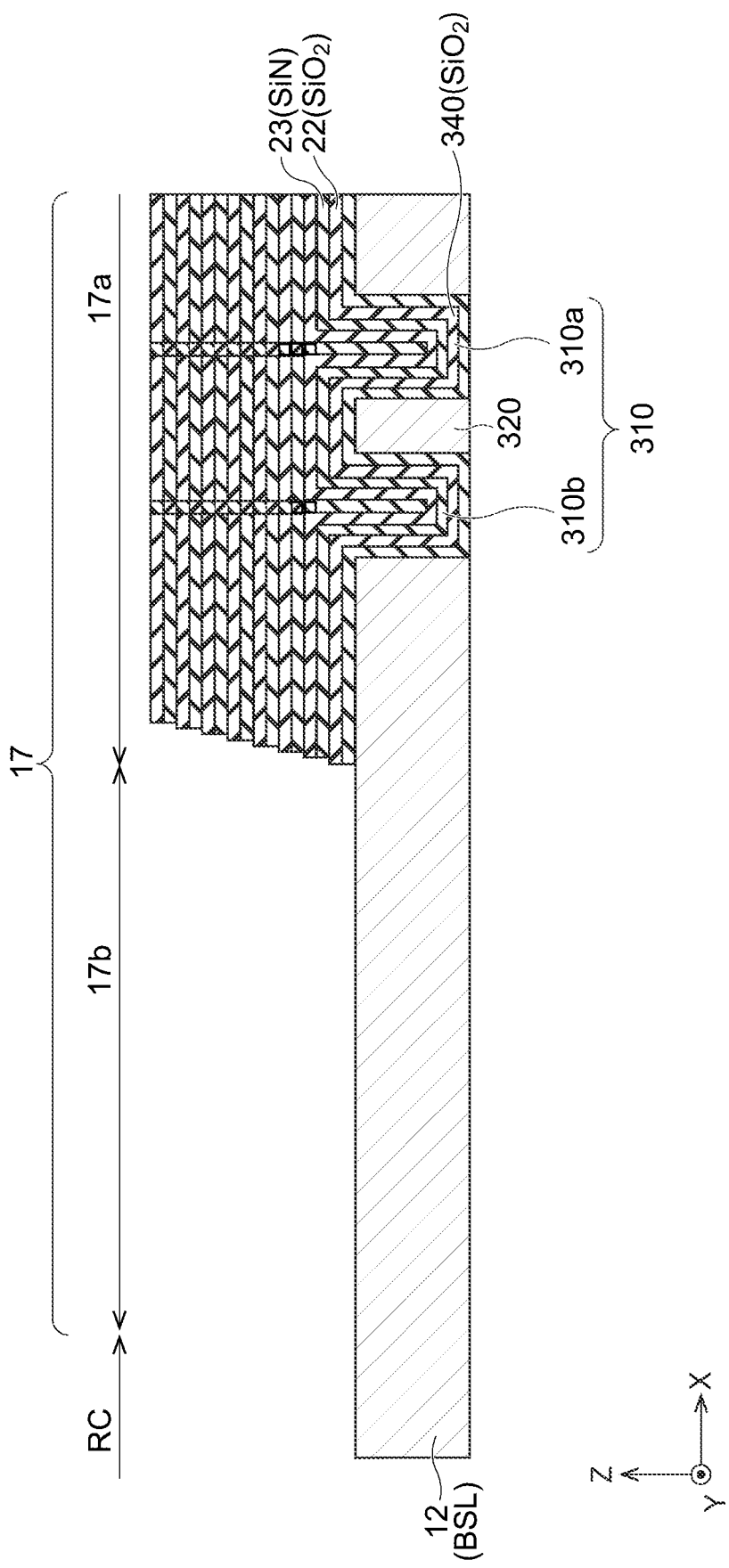
FIG. 30 is a cross-sectional view illustrating an example of a manufacturing method of the semiconductor storage device according to the sixth embodiment.

FIG. 30 is a cross-sectional view illustrating an example of a manufacturing method of the semiconductor storage device 100*a* according to the sixth embodiment. In the semiconductor storage device 100*a* according to the sixth embodiment, after the step illustrated in FIG. 26 is performed, the slits 310*a* and 310*b* are not filled with the insulation film 340. Thereafter, the insulation layer 22 and the sacrifice film 23 are alternately stacked on the conductive layer 12 and the like and in the slits 310*a* and 310*b*. Accordingly, the stacked structure of the insulation layers 22 and the sacrifice films 23 is formed also in the slits 310*a* and 310*b*, and is continuously formed also on the slits 310*a* and 310*b* as illustrated in FIG. 30. Thereafter, the interlayer dielectric film 24 and the like are formed in an identical manner to that in the fifth embodiment. With this process, the structure illustrated in FIG. 29 is obtained.

Also in the sixth embodiment, it is also possible to obtain effects identical to those of the fifth embodiment. Even when film separation occurs between a stacked structure of the insulation layers 22 and the sacrifice films 23 and the conductive layer 12 and the like in the ±X-direction, it is possible to guide the film separation in the −Z-direction by the slits 310*a* and 310*b*, thereby preventing growth of the film separation toward the edge seal region 17*b* or the chip region RC.

Further, in the sixth embodiment, the insulation layer 22 and the sacrifice film 23 are partly stacked in a lateral direction in the slits 310*a* and 310*b*, and a boundary between the insulation layer 22 and the sacrifice film 23 extends in the Z-direction. Therefore, film separation can be guided in the −Z-direction also by the boundary between the insulation layer 22 and the sacrifice film 23. Accordingly, in the sixth embodiment, it is possible to restrict growth of film separation toward the edge seal region 17b or the chip region RC more securely.

Figure 31:
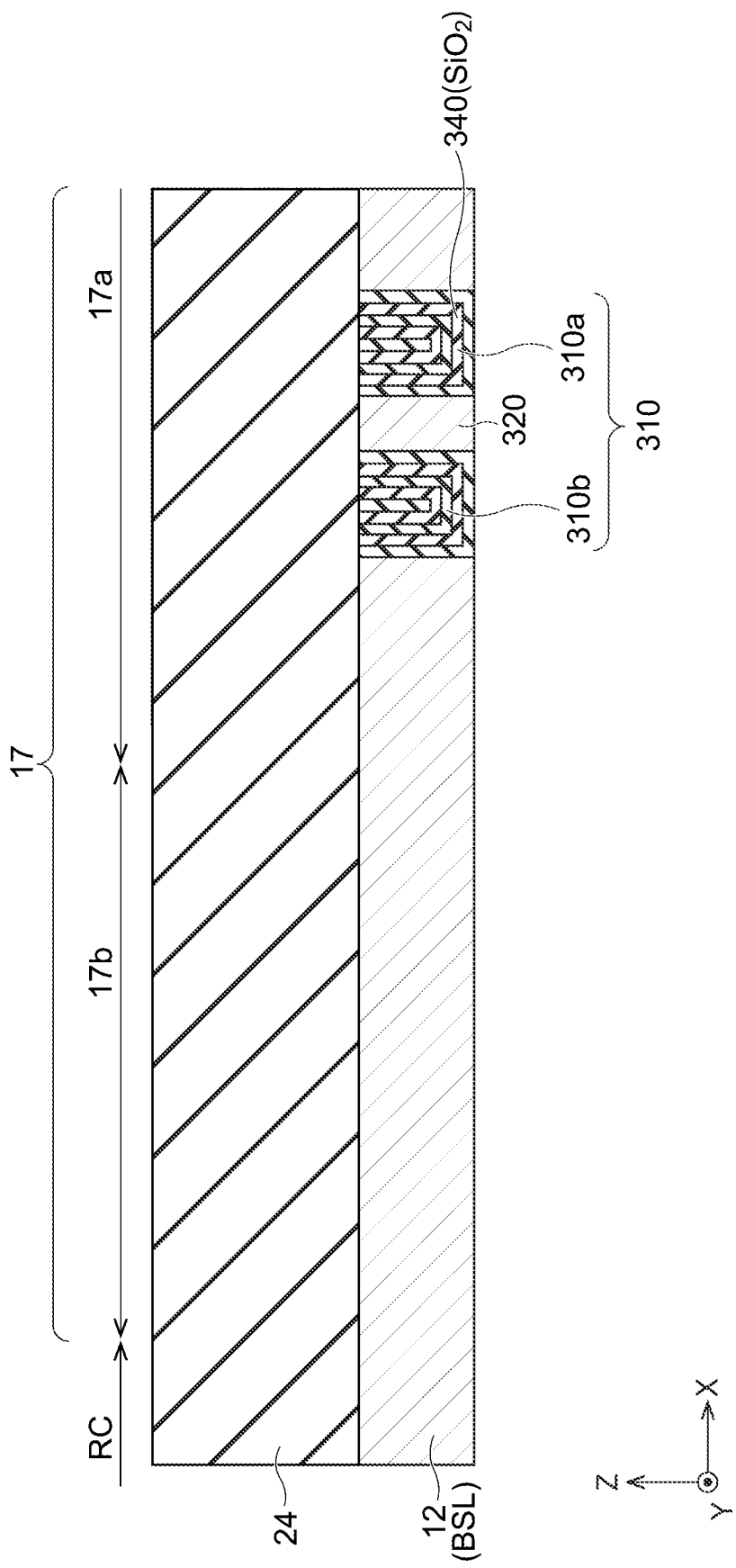
FIG. 31 is a cross-sectional view of the semiconductor storage device in which the interlayer dielectric film is provided on the slits.

In FIG. 29, the stacked structure of the insulation layers 22 and the sacrifice films 23 (the ONON stacked structure) is provided on the slits 310a and 310b. However, the interlayer dielectric film 24 may be provided on the slits 310a and 310b as illustrated in FIG. 31. FIG. 31 is a cross-sectional view of the semiconductor storage device 100a in which the interlayer dielectric film 24 is provided on the slits 310a and 310b. Also in this case, the stacked structure of the insulation layers 22 and the sacrifice films 23 is left in the slits 310a and 310b. Accordingly, it is possible to prevent growth of film separation toward the edge seal region 17b or the chip region RC.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
  a semiconductor substrate;
  a first insulation film provided on the semiconductor substrate;
  a first conductive film provided on the first insulation film;
  a plurality of first electrode films provided above the first conductive filtn and stacked in a first direction to be apart from each other;
  a semiconductor member extending in the first direction in the plurality of first electrode films; and
  a charge accumulation member provided between the plurality of first electrode films and the semiconductor member, wherein the first conductive film includes;
  a main body arranged below the plurality of first electrode films,
  an outer peripheral portion provided in an outer periphery of the main body to be apart from the main body and including a first portion extending in a second direction crossing the first direction,
  a protrusion connecting the main body and the outer peripheral portion, extending in a third direction crossing the first direction and the second direction, and divided in the third direction by an insulation member, and
  a plurality of first slits and a plurality of second slits alternateiv provided in the second direction along the first portion, respectively extending in the first direction and the second direction in the first portion, being apart from each other in the third direction, and partly overlapping each other in the third direction.

2. The device of claim 1, wherein a stacked structure in which a silicon oxide film and a silicon nitride film are alternately stacked is provided in the first and second slits.

3. The device of claim 2, wherein a stacked structure in which a silicon oxide film and a silicon nitride film are alternately stacked is provided above the first and second slits.

4. The device of claim 1, wherein a silicon oxide film is provided in the first and second slits.

5. The device of claim 1, wherein the first and second. slits are arranged in the outer peripheral portion in a zigzag pattern or a checkered pattern as viewed in the first direction.

6. The device of claim 1, wherein a connector formed by the first conductive film is provided between the first slit and the second slit as viewed in the first direction, and the connector electrically connects the first conductive film on a side of the first and second slits which is close to the main body and the first conductive film on a dicing region side of the first and second slits to each other.

7. The device of claim 1, wherein the first conductive film is a source layer electrically connected to the semiconductor member.

8. The device of claim 1, further comprising a CMOS (Compietnentary Metal Oxide Semiconductor) circuit provided below the first conductive film and on the semiconductor substrate.

9. The device of claim 1, wherein
  the outer peripheral portion further includes a second portion extending in the third direction,
  a plurality of third slits and a plurality of forth slits are alternately provided in the third direction along the second portion, respectively extend in the first direction and the third direction in the second portion, are apart from each other in the second direction, and partly overlap each other in the second direction.

* * * * *